United States Patent [19]
Takeuchi et al.

[11] Patent Number: 6,154,391
[45] Date of Patent: Nov. 28, 2000

[54] NONVOLATILE SEMICONDUCTOR MEMORY DEVICE

[75] Inventors: Ken Takeuchi, Tokyo; Tomoharu Tanaka, Yokohama, both of Japan

[73] Assignee: Kabushiki Kaisha Toshiba, Kawasaki, Japan

[21] Appl. No.: 09/153,074

[22] Filed: Sep. 15, 1998

[30] Foreign Application Priority Data

Sep. 18, 1997 [JP] Japan .................................. 9-253817

[51] Int. Cl.$^7$ .................................................. G11C 16/04
[52] U.S. Cl. ........................ 365/185.24; 365/185.03; 365/185.29
[58] Field of Search ................ 365/185.03, 185.24, 365/185.17, 185.22, 185.29

[56] References Cited

U.S. PATENT DOCUMENTS

| | | | |
|---|---|---|---|
| 5,428,568 | 6/1995 | Kobayashi et al. ..................... | 365/185 |
| 5,491,657 | 2/1996 | Haddad et al. ..................... | 365/185.27 |
| 5,521,867 | 5/1996 | Chen et al. ......................... | 365/185.33 |
| 5,910,913 | 6/1999 | Kato et al. ......................... | 365/185.11 |
| 6,005,802 | 12/1999 | Takeuchi et al. .................. | 365/185.02 |

FOREIGN PATENT DOCUMENTS 8-158548  6/1996  Japan .

*Primary Examiner*—Son T. Dinh
*Assistant Examiner*—Hien Nguyen
*Attorney, Agent, or Firm*—Banner & Witcoff, Ltd.

[57] ABSTRACT

A nonvolatile semiconductor memory device comprises an electrically rewritable memory cell transistor, in which a threshold voltage of an erase state of the memory cell transistor is a negative voltage, and a distribution of a threshold voltage of a programming state of the memory cell transistor is a distribution including a negative voltage region.

57 Claims, 15 Drawing Sheets

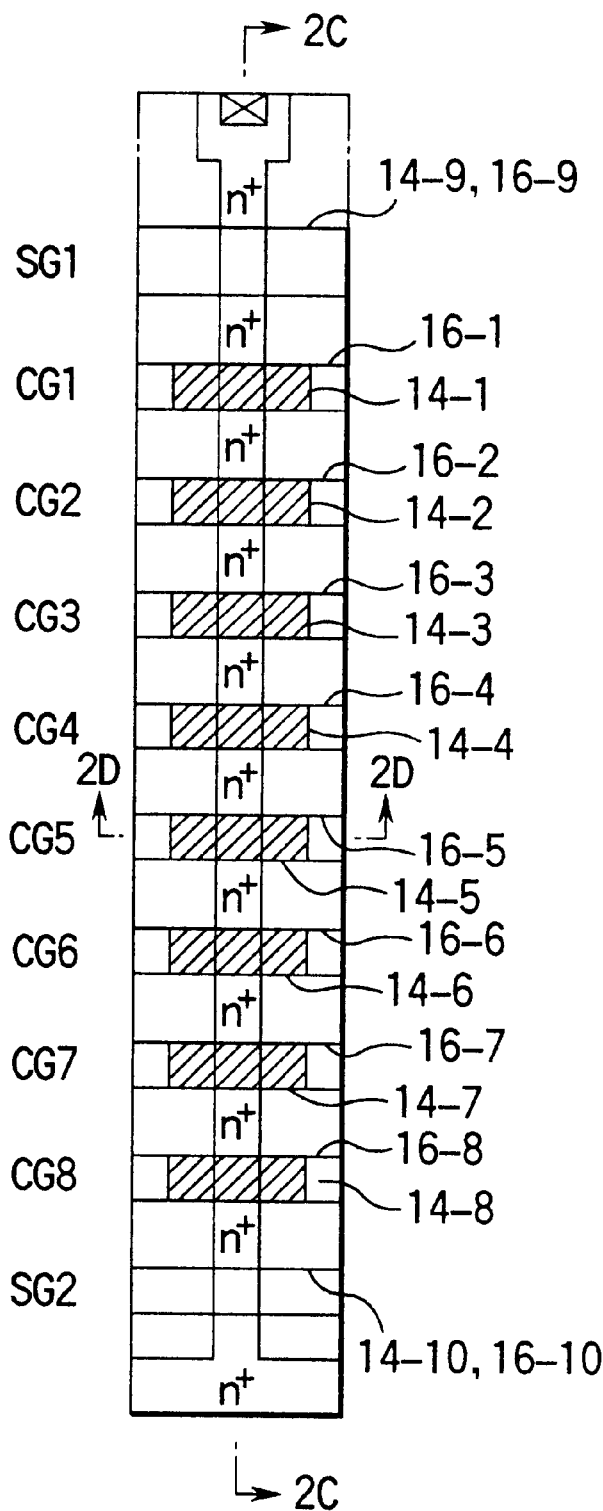
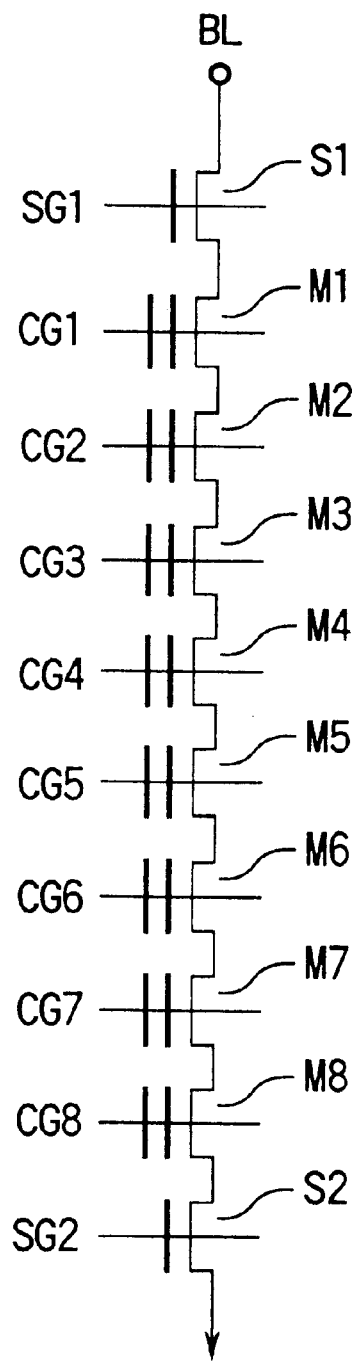
FIG. 2A
FIG. 2B

NONVOLATILE SEMICONDUCTOR MEMORY DEVICE

BACKGROUND OF THE INVENTION

The present invention relates to an electrically rewritable nonvolatile semiconductor memory device.

In recent years, as one of the electrically rewritable nonvolatile semiconductor memory devices (EEPROM) of the data, NAND type EEPROM is proposed.

NAND type EEPROM has the following structure. A plurality of memory cell having an N-channel FETMOS structure, wherein a charge storage layer (e.g. a floating gate) and a control gate is layered, are connected in series in the form of which sources and drains of adjacent ones are shared. NAND type EEPROM is constituted by connecting between a source line and a bitline as one unit (NAND cell).

FIG. 1A is a circuit diagram of the NAND cell.

In FIG. 1A, memory cells M1 to M8 is connected in series to each other and constitutes a NAND cell. CG1 to CG8 are control gates, respectively. One end of the NAND cell is connected to a bitline BL through a select transistor S1 and the other end is connected to a source line SL through a select transistor S2. SG1, SG2 are select gates, respectively.

FIG. 1B is the figure showing a distribution of the threshold voltage of the conventional memory cell in NAND type EEPROM.

In FIG. 1B, "0" indicates an erase state and "1" indicates a programmed state, respectively. The threshold voltage of the memory cell of the "0" state is the negative voltage of equal to or less than 0V and the threshold voltage of the memory cell of the "1" state has the positive voltage of equal to or more than 0V. "Vth0" is a threshold voltage after erasing data by irradiating ultraviolet rays (hereinafter, called to as an UV erasure) and is substantially established in the middle of the "0" state and the "1" state.

Hereinafter, an operation of the NAND type EEPROM will be explained.

<Data Programming>

0V ("1" programming) or Vcc of, e.g. 3V ("0" programming) line voltages are applied to the bitline BL according to the programmed data. The select gate SG1 is a power supply voltage Vcc and the select gate SG2 is 0V.

In case of "1" programming, since the select transistor S1 connected to the bitline BL turns "on", 0V are transmitted to the channel of the memory cell to which "1" is programmed. Also, in case of "0" programming, since the select transistor turns "off", the channel voltage of the memory cell which is programmed to "0" becomes "Vcc−Vthsg (Vthsg is the threshold voltage of the select gate)", and becomes floating. When the memory cell which has the more positive threshold voltage Vthcell on the bitline side than the memory cell to which "0" is programmed exists, the voltage of the channel of the memory cell to which "0" is programmed becomes "Vcc−Vthcell". Thereafter, the programming voltage Vpp (=about 20V) which the voltage was boosted is applied to the control gate of the memory cell to which is selected to be programmed, the intermediate voltage Vpass (=about 10V) is applied to the control gate of the other unselected memory cells. As a result, when the programming data is "1", since the voltage of the channel is 0V, a high voltage is applied among the floating gate of the memory cell to which is selected to be programmed and the p-type well or the p-type substrate, then, electrons are tunnel-injected from the p-type well or the p-type substrate to the floating gate. This makes the threshold voltage of the memory cell which is selected to be programmed moving to the positive direction. When the programmed data is "0", the voltage of the floating channel becomes the intermediate voltage by the capacitive coupling with the control gate and the electrons are not injected to the floating gate.

<Data Erasure>

The erasure of the data is substantially performed at the same time by the block unit. That is, the voltage of all control gates in the block which erases data and the voltage of the select gate are set to 0V, respectively, and the boosted voltage VppE (=about 20V) which is boosted is applied to each of the p-type wells and the n-type substrate. Then, the boosted voltage VppE is applied respectively to the control gate and the select gate in the block which does not erase data. Thereby, at the memory cells in the block which erases data, the electrons in the floating gate is discharged by the p-type well and each threshold voltage moves to the negative direction.

<Data Read>.

A data reading is performed as follows. The bitline BL is set at a floating state after being precharged. Then, the voltage of the control gate of the memory cell which is selected to be read is set at the reading voltage of 0V, the voltage of the control gate of the other memory cells and the voltage of the select gate are set at a unselected read voltage Vread (power supply voltage Vcc), respectively, and a source line is set at 0V. Then, whether or not the current flows through the memory cell which is selected to be read is detected by the bitline BL. That is, since the memory cell becomes "off" state if the programmed data in the memory cell is "1" (the threshold voltage of the memory cell Vth>read voltage 0V), the voltage of the bitline keeps precharge voltage. On the other hand, since the memory cell becomes "on" state if the programmed data in the memory cell is "0" (the threshold voltage of the memory cell Vth<read voltage), the voltage of bitline BL falls only ΔV from the precharge voltage. The data of the memory cell is read by detecting such a change of the voltage of the bitline BL by the sense amplifier.

In the data programming in the conventional NAND type, when "0" programming, in case that the memory cell which has more positive threshold voltage Vthcell than the memory cell to which "0" is programmed is exists on the bitline side, the "threshold voltage drop" occurs between the drain and the source of this memory cell. As a result, the voltage of the channel of the memory cell to which "0" is programmed becomes "Vcc−Vthcell". Thereafter, a floating channel is capacitive-coupled by the control gate and the voltage of the channel is set at the intermediate voltage. For example, when the capacity of the diffusion layer of the memory cell is as the capacity between the control gate and the channel, every time the control gate rises by 1V, the channel voltage goes up only 0.5V. In other words, the channel voltage of the memory cell can not be sufficiently enhanced. Therefore, the voltage difference between the control gate and the channel does not become sufficiently small, the unnecessary electrons are injected to the unselected memory cells which are unnecessary to program, and a mis-programming is occurred.

In the NAND type, when data is read from the memory cell selected for reading in the NAND cell, the other memory cells, i.e. all of unselected memory cells for reading are conducted. A memory cell which stores data "1" in the unselected memory cell for reading exists. In the reading of the present data, reading voltage Vread (e.g., Vcc) is given to the unselected control gate to conduct the unselected memory cell for reading. When the data of the unselected memory cell for reading is "0" at this time, there is possibility that so-called read disturb where electron is injected from the channel to the floating gate by the large electric field between the channel and the gate occurs. When read disturb occurs, data in the memory cell is destroyed. Especially, there is a problem that the read disturb occurs easier because threshold voltage Vth becomes higher than read voltage Vread, too, when the threshold voltage Vth of the memory cell of the programmed state becomes high with making a multi-value to cause read disturb more.

Moreover, there is a problem that, since a large read current is hardly obtained in a multi-level cell with high threshold voltage in the programmed state, the high-speed read operation is obstructed.

This is caused that a read current flowing through the memory cell depends on Vg–Vth and increases as that Vg–Vth is large, when Vgs is a voltage between the gate and the source of the memory cell and Vth is a threshold voltage of the memory cell at the time of the data reading.

The tendency that the threshold voltage Vth of the memory cell becomes high when making data a multi-level in this way, that large read current is hardly obtained and that the speeding-up of read operation is prevented is not only NAND type. It has a similar tendency in the NOR type in which memory cells connected in parallel between the source line and the bitline. In addition, it has a similar tendency in the AND type arid the DINOR type in which a plurality of memory cells are connected in parallel between the source line and the bitline as the unit cell.

BRIEF SUMMARY OF THE INVENTION

An object of the present invention is to a nonvolatile semiconductor memory device capable of preventing a mis-programming and reducing a read disturb in a nonvolatile semiconductor memory device, which can electrically rewrite data, having a memory cell in which data is identified by whether or not a current flows through a channel of the memory cell. Moreover, an object of the present invention is to provide the nonvolatile semiconductor memory device in which it is possible to read the data at higher speed and which is favorable to make memory data a multi-level.

Another object of the present invention is, especially, in the nonvolatile semiconductor memory device having a plurality of memory cell connected in series between a first signal line and a second signal line as the unit cell, to provide a nonvolatile semiconductor memory cell capable of reducing a possibility of "mis-programming" occurred to the memory cell "0" programming not to change a threshold voltage, or unselected for programming when data programming, and a possibility of read disturb occurred in the unselected memory cell for reading when data is read.

To achieve the above object, the present invention comprises an electrically rewritable memory cell transistor, and a threshold voltage of an erase state of the memory cell transistor is a negative voltage, and a distribution of a threshold voltage of a programming state of the memory cell transistor is a distribution including a negative voltage region. Also, all threshold voltages of the erase state and the programming state of the memory cell transistor have negative value.

According to the present invention, since the threshold voltage of the memory cell at the programmed state has negative voltage, "threshold voltage drop" between the source and drain of the memory cell can be prevented.

Moreover, since the read current at the time of the data reading increases to speed up a read operation, it is favorable to make a memory data multi-level.

To achieve the above another object, the present invention comprises a plurality of electrically rewritable memory cell transistors connected in series, and a distribution of a threshold voltage of a programming state of the memory cell transistor is a distribution including a negative voltage region.

According to the present invention, since the threshold voltage of the memory cell at the programming state has negative voltage, after transferring the voltage according to the data without changing a threshold voltage to the channel in the unit cell from the first signal line or the second signal line, the potential of the channel of the selected memory cell for programming in this unit cell can be made a value with sufficiently small voltage difference between the control gate and the channel. At this time, the voltage of the channel of the unselected memory cell for programming in this unit cell, also, becomes a sufficiently small value with voltage difference between the control gate and the channel. Thereby, the possibility of "mis-programming" which occurs in programming without change of a threshold voltage, or to the unselected memory cell for programming can be reduced when data programming.

Moreover, the possibility of read disturb which occurs to the unselected memory cell for reading by lowering an applied voltage Vread to the gate of the unselected memory cell for reading can be reduced, when reading data.

In above invention, it is preferred all threshold voltages of the erase state and the programming state of the memory cell transistor have negative value.

Also, to achieve the above object, a nonvolatile semiconductor memory device comprises a memory cell transistor capable of storing n-levels (n is equal to or more than 2), and the memory cell transistor stores n-level data where the threshold voltage regions of discrete first, second, . . . , n-th the data are set in low order of the threshold voltage, the first threshold voltage region is in an erase state, the second, . . . , n-th threshold voltage regions are in a programmed state, and at least one distribution of the second, . . . , n-th threshold voltage regions is a distribution including a negative region.

The preferred manners of above-mentioned nonvolatile semiconductor memory device are as follows.

(1) The n is equal to or more than 3, the first threshold voltage region is in an erase state, the second to m-th threshold voltage regions are in a programmed state, and the second to m-th threshold voltage regions have a positive voltage and a negative voltage.

(2) The memory cell transistor has a charge storage layer, a threshold voltage of the memory cell transistor is determined by the charge stored in the charge storage layer, and a threshold voltage of the memory cell transistor when not holding a charge in the charge storage layer is between a threshold voltage of the programmed state and a threshold voltage of the erase state.

(3) A threshold voltage of the memory cell transistor when not holding a charge in the charge storage layer is between a minimum voltage of a threshold voltage of the programmed state and a maximum voltage of a threshold voltage of the erase state.

(4) The memory cell unit including the memory cell transistor having an end electrically coupled to the first signal line and another end electrically coupled to the second signal line further comprises a data circuit, for holding data read from the memory cell transistor, and when reading data from the memory cell transistor, the second signal line is set at a read reference voltage, a voltage of the first signal line charged through the memory cell unit is sensed by the data circuit.

(5) The memory cell unit including the memory cell transistor having a end electrically coupled to the first signal line and another end electrically coupled to the second signal line further comprises a data latch circuit, for holding data read from the memory cell transistor, and during programming verify when a state of the memory cell transistor after programming operation is confirmed whether or not it becomes a state corresponding to a desired data and a programming content of the data latch circuit supposed to rewrite only the memory cell transistor which does not reach a state corresponding to the desired data, contents of the data latch circuit are updated based on a voltage of the first signal line changed from the second signal line that is biased to a read reference voltage through the memory cell unit and a programming data held in the data latch circuit.

(6) The first signal line is a bitline and the second signal line is a source line.

(7) The memory cell transistor is N-channel type.

According to the present invention, in the nonvolatile semiconductor memory unit, in which the data is electrically rewritable, having the memory cells which identifies data by changing a threshold voltage and whether or not the current flows through the channel of the memory cell, an evading of mis-programming in programming and the reduction of read disturb can be achieved, moreover, the nonvolatile semiconductor memory unit which is possible to read the data at higher speed and is favorable to make memory data a multi-level can be provided.

Especially, in the nonvolatile semiconductor memory unit which has a plurality of memory cells connected in series between a first signal line and a second signal line, a nonvolatile semiconductor memory unit which can reduce a possibility of "mis-programming" which occurs at "0" programming without changing a threshold voltage or to the unselected memory cell for programming when data programming, and a possibility of read disturb which occurs to the unselected memory cell for reading when data reading can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2A shows a circuit diagram view of the NAND cell, FIG. 2B shows an equivalent circuit of the NAND cell.

DETAILED DESCRIPTION OF THE INVENTION

Hereinafter, NAND type EEPROM will be explained for the example in the embodiment of the present invention.

NAND type EEPROM is constructed that a plurality of memory cells having the n-channel FETMOS structure, in which a charge storage layer (e.g., a floating gate) and a control gate are layered, are connected in series in the form in which those sources and drains of adjacent ones are shared. This is connected to a bitline as one unit.

Figure 1A:
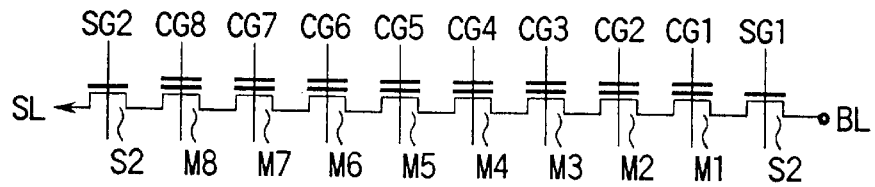
FIG. 1A shows an equivalent circuit diagram of the NAND cell.
Figure 1B:
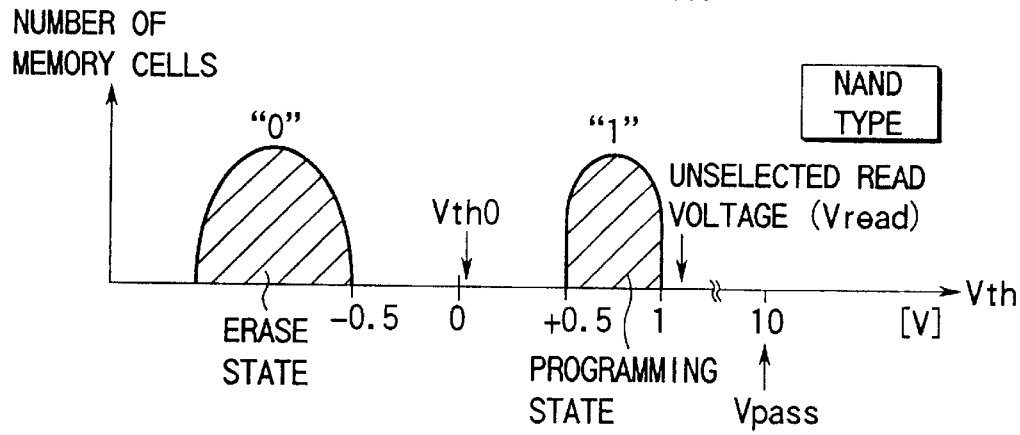
FIG. 1B shows a distribution of the conventional threshold voltage of NAND type EEPROM.
Figure 2C:
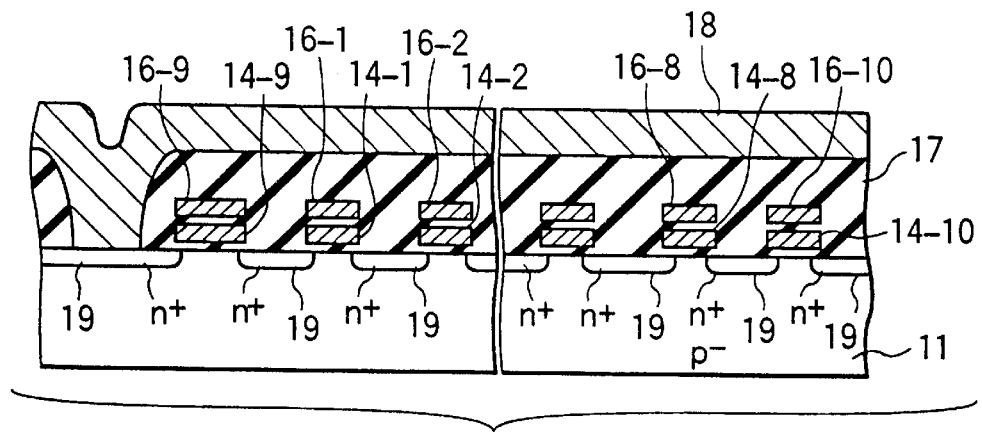
FIG. 2C shows a sectional view taken along a line 2C—2C in FIG. 2A.
Figure 2D:
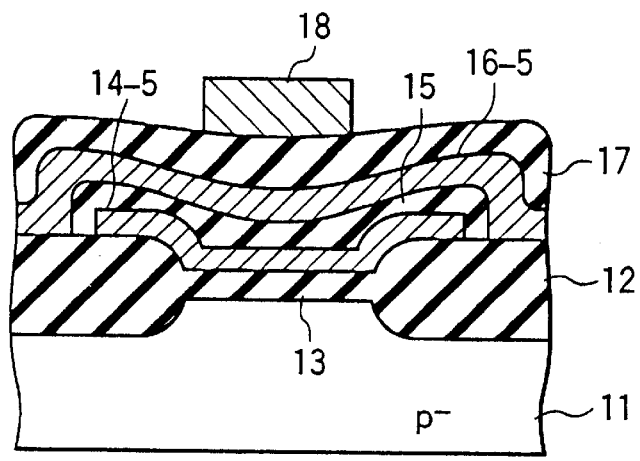
FIG. 2D shows a sectional view taken along a line 2D—2D in FIG. 2A.

FIG. 2A is a plan view showing a one unit of the NAND cell. FIG. 2B shows an equivalent circuit thereof. FIG. 2C is a sectional view taken along the line 2C—2C in FIG. 2A and FIG. 2D is a sectional view taken along the line 2D—2D in FIG. 2A.

The memory cell array surrounded by element isolation oxide film 12 is formed in p⁻-type silicon substrate (or memory cell p⁻-type well) 11. A plurality of NAND cells are integrated by the memory cell array. In this embodiment, eight memory cells M1 to M8 are connected in series to constitute one memory cell unit of the NAND cell when explaining, for example, one unit of the NAND cell. The memory cell has layered gate structure each having a floating gate 14 (14-1 to 14-8) formed on the substrate 11 through a gate insulation film 13 and a control gate 16 (16-1 to 16-8) formed on the floating gate 14 through a second gate insulation film 15. The n⁺-type diffusion layers 19 which are the sources and the drains of these memory cells are shared by the adjacent ones, thereby the memory cells are connected in series.

A first select transistor S1 is connected to the drain side of the NAND cell and a second select transistor S2 is connected to the source side of the NAND cell. The select transistor S1 has the layered gate structures 14-9 and 16-9 which are simultaneously formed with the floating gates 14-1 and 14-8 and the control gates 16-1 to 16-8 of the memory cell, and the select transistor S2 has also similar layered gate structures 14-10 and 16-10. Each of the gate structures 14-9 and 16-9 of select transistor S1 and the gate structures 14-10 and 16-10 of the select transistor S2 are connected to each other at a part not shown. The substrate 11 that an element is formed is covered with a CVD oxide film 17 and a bitline (BL) 18 is formed on the CVD oxide film 17. For example, the control gates 16-1 to 16-8 of the memory cells M1 to M8 are continuously formed in a row direction to become control gates CG1 to CG8 being common at the same row and function as a word line. Also, the layered gate structures 14-9 and 16-9 of the select transistor S1 and the layered gate structures 14-10 and 16-10 of the select transistor S2 are also continuously formed in a row direction and function as select gates SG1 and SG2 being common, for example, at the same row.

Figure 3:
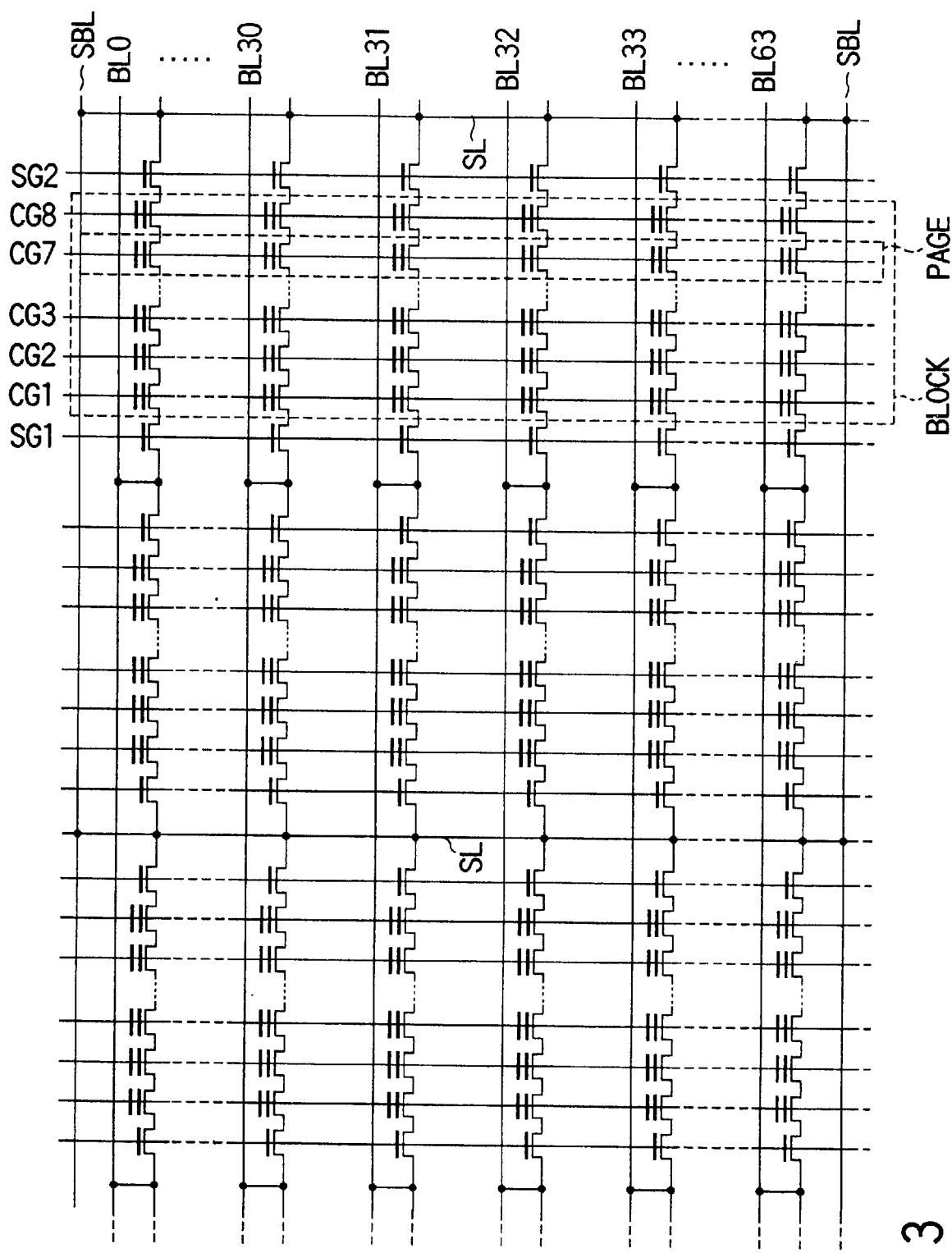
FIG. 3 is an equivalent circuit of the memory cell array.

FIG. 3 is an equivalent circuit diagram of the memory cell array where the NAND cell shown in FIG. 2A to FIG. 2D is arranged in a matrix form.

As shown in FIG. 3, the source line SL is, for example, connected to the reference voltage wiring SBL which is composed of aluminum, conductive polysilicon and so on through one contact for every 64 bitlines BL. This reference voltage wiring SBL is connected to the peripheral circuit of the memory (not shown). For example, the peripheral circuit thereof is the source line control circuit for controlling the state of source line SL according to each mode of the programming of data, the erasure of the data, the reading of the data. The control gates CG1 to CG8 of the memory cell, and select gates SG1 and SG2 are continuously arranged in the row direction. Generally, the set of the memory cell connected to the control gate CG is called "a page". The set of "the page" sandwiched by one set of select gates SG1 and SG2 is called a "NAND block" or simply a "block". For example, one page is composed of the 256 bytes (256×8) memory cells and the data is substantially programmed at the same time into the memory cell for one page. For example, one block is composed of the 2048 bytes (2048×8) memory cells and the data of the memory cells for one block are substantially erased at the same time.

Figure 4:
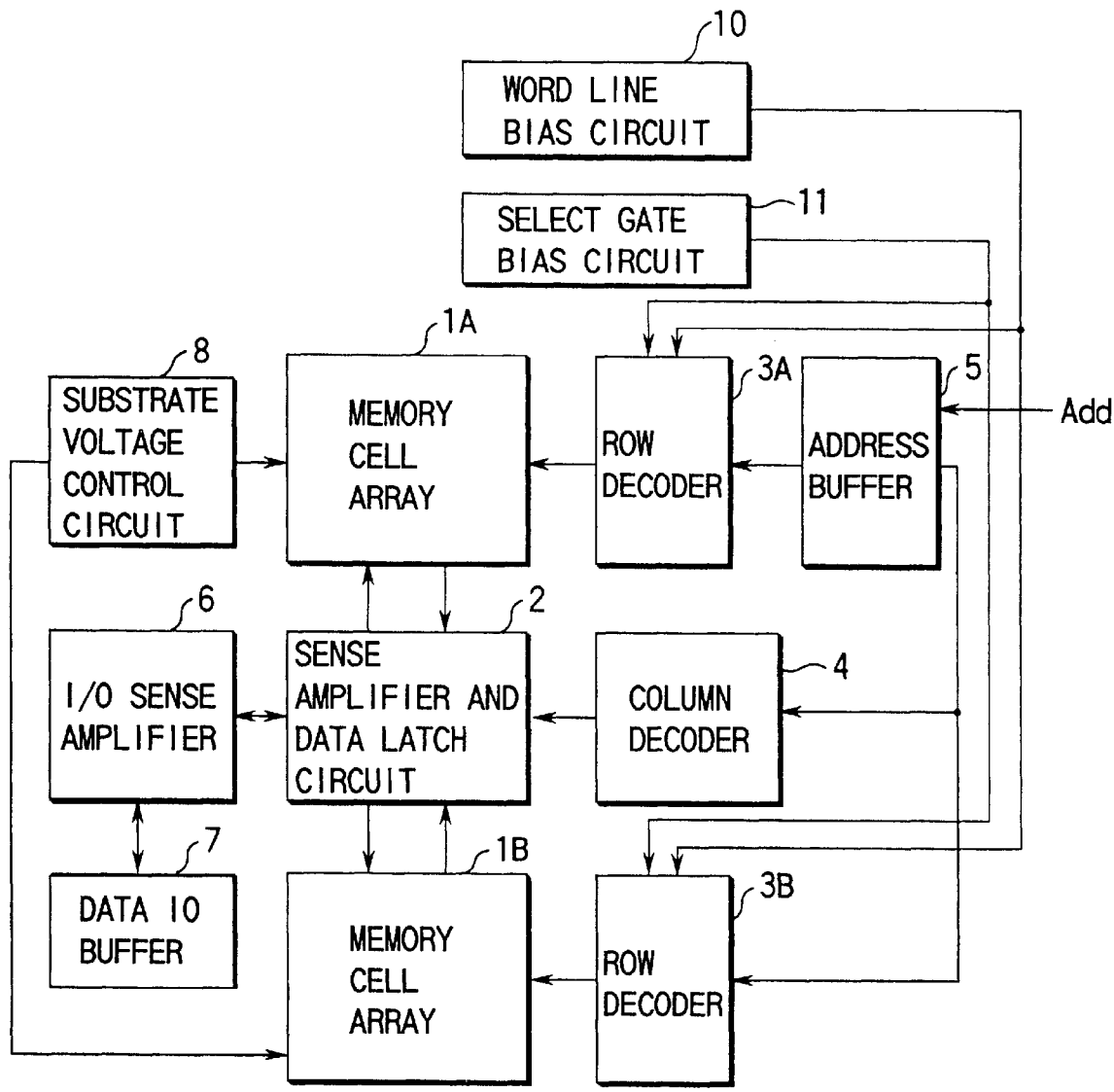
FIG. 4 is the block diagram of the EEPROM according to the first embodiment of the present invention.

FIG. 4 is a block diagram showing the structure of the NAND type EEPROM according to a first embodiment of the present invention.

In FIG. 4, reference numeral 1 is a memory cell array as the memory means. Since in this embodiment a bitline scheme is an open bitline scheme, a memory cell array is divided into two arrays of arrays 1A and 1B. Reference numeral 2 is a sense amplifier and a data latch circuit as the latch means for programming and reading data. Reference numeral 3 is a row decoder for selecting a word line, reference numeral 4 is a column decoder for selecting a bitline, reference numeral 5 is an address buffer, reference numeral 6 is an I/O sense amplifier, reference numeral 7 is a data input/output buffer, and reference numeral 8 is a substrate potential control circuit.

Figure 5:
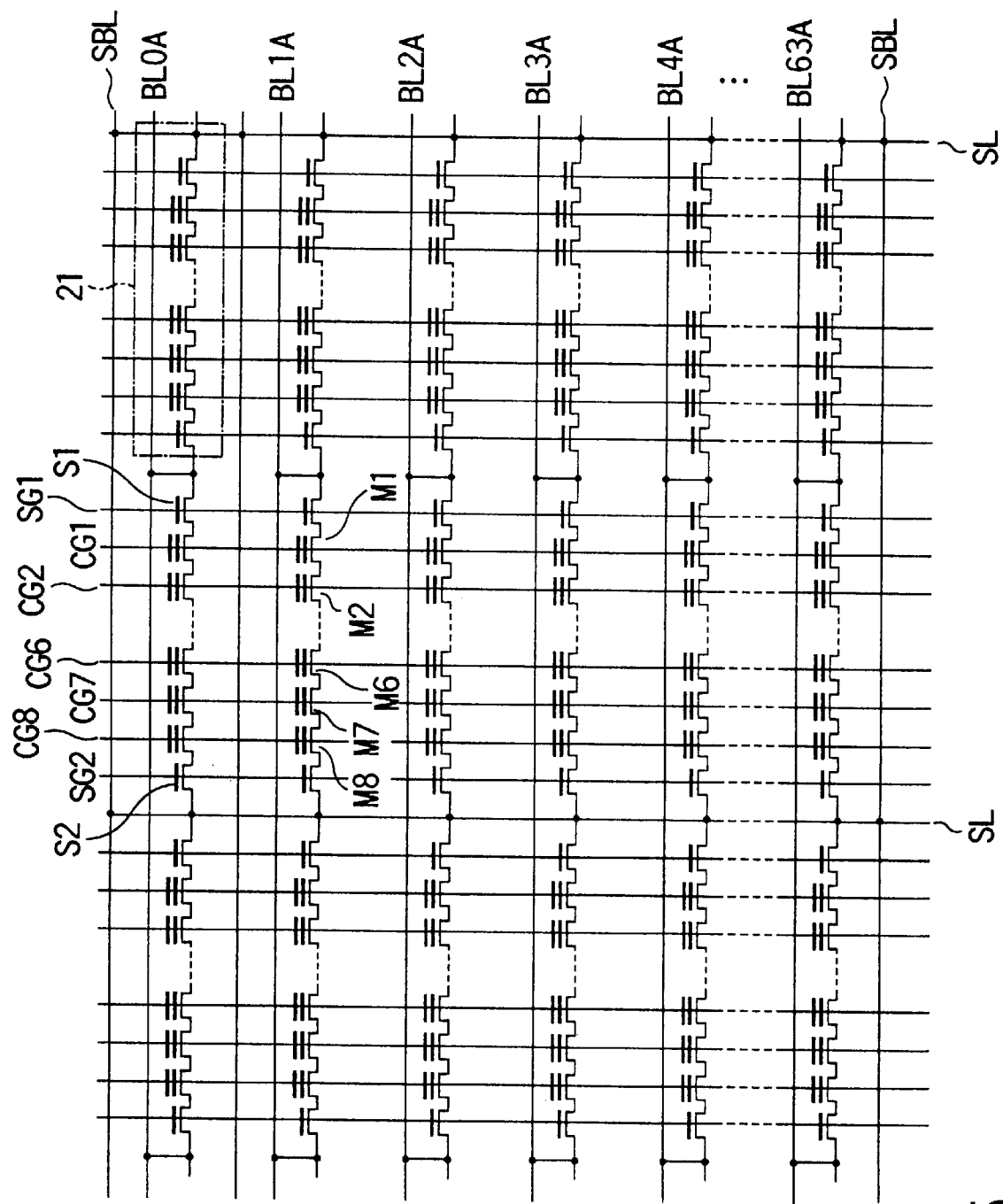
FIG. 5 is a circuit diagram of the memory cell array shown in FIG. 4.

FIG. 5 is a circuit diagram showing a structural example of the memory cell array 1A in FIG. 4.

Figure 6:
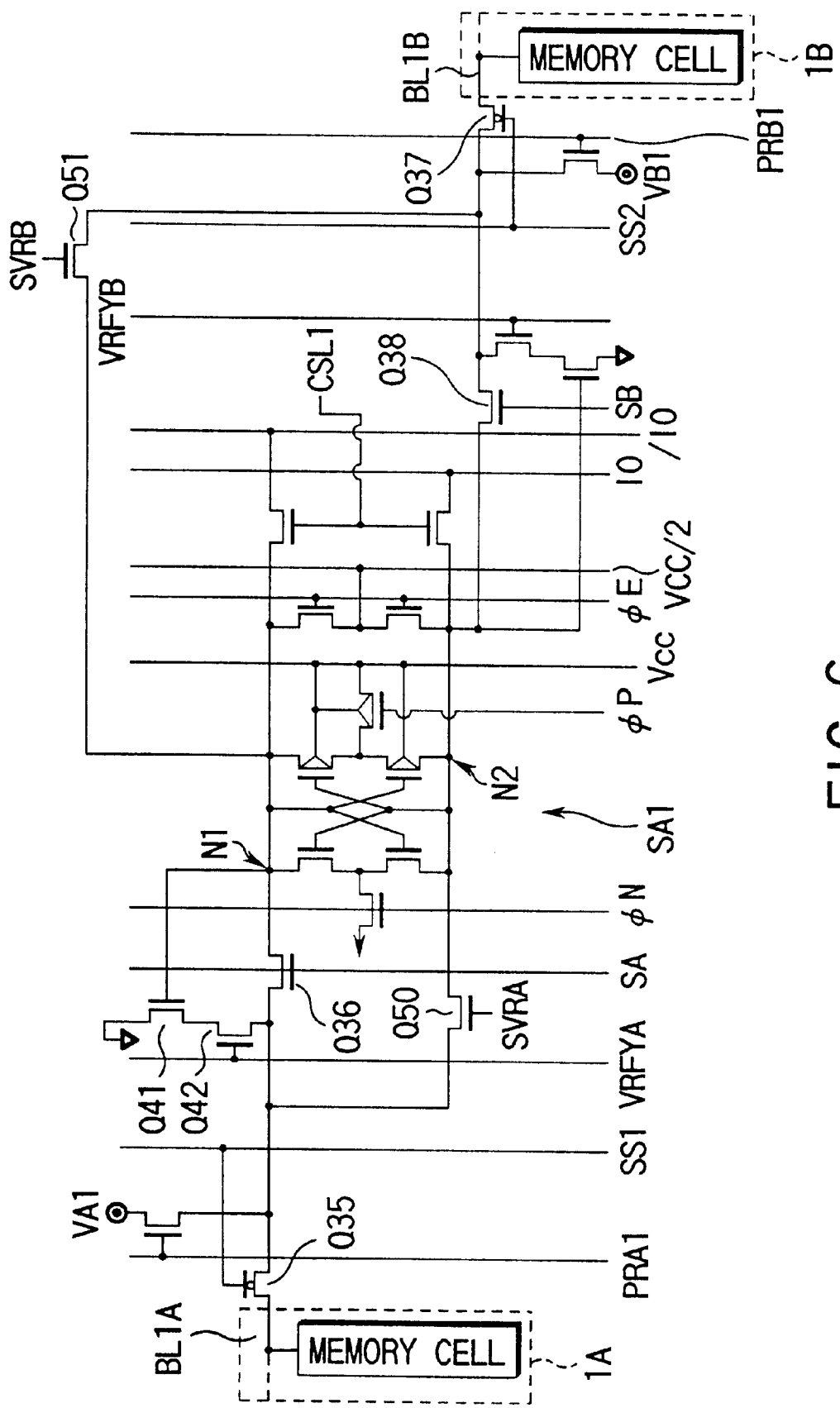
FIG. 6 is a circuit diagram of the sense amplifier shown in FIG. 4.

FIG. 6 is a circuit diagram showing a structural example of a sense amplifier and data latch circuit 2 in FIG. 4.

Figure 7:
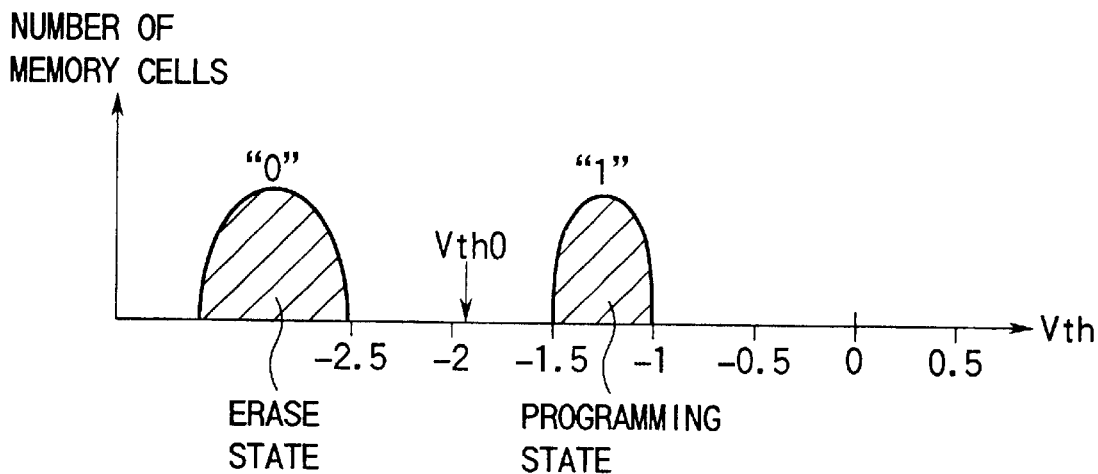
FIG. 7 is a distribution of the threshold voltage of the EEPROM according to a first embodiment of the present invention.

FIG. 7 is a distribution of the threshold voltage of the memory cell according to the first embodiment of the present invention.

As shown in FIG. 7, in the first embodiment, both of the threshold voltage of programmed state ("1") and the threshold voltage of erase state ("0") have a negative voltage. The threshold voltage Vth0 (in other words, the threshold voltage when there is no charge in the floating gate) after UV erasure may be set at between the "0" state and the "1" state as shown in FIG. 7. The setting value of Vth0 can be changed in adjusting the quantity of the impurities injected to the channel of the memory cell transistor.

When programmed state ("1") has a negative threshold voltage in this way, when programming "0" especially in programming, unselect voltage for programming "Vcc−Vthsg (Vthsg is the threshold voltage of the select gate)" can be transferred to the channel of the memory cell from the bitline without "threshold voltage drop" at the memory cell.

Also, if the gate voltage (SG1) of the select gate S1 connected to the bitline is set at "Vcc+Vthsg" or "Vcc+2Vthsg", unselect voltage for programming Vcc can be transferred to the channel of the memory cell from the bitline. In this case, if the gate voltage (SG1) of the select gate S1 connected to the bitline after transferring the voltage Vcc of the bitline to the channel of the memory cell "Vcc", it is possible to make the channel of the memory cell to be a floating state at voltage "Vcc". Thereafter, for example, the channel of the memory cell programmed in "0" is booted to 8V by making a control gate (the word line) a programming voltage Vpp or a middle voltage Vpass.

The unselect voltage for programming can be transferred to the channel of the memory cell programmed in "0" in programming by making the threshold voltage of programmed state ("1") a negative voltage like erase state ("0") from the bitline without being the "threshold voltage drop" with the memory cell. Thereby, the voltage of the channel becomes large compared with the conventional art. As a result, the voltage difference between the control gate and the channel becomes smaller and the mis-programming can be prevented.

Moreover, in the method to set the channel at the floating state by cutting off the select gate S1 and lowering the voltage of the select gate SG1 after transferring the unselect voltage for programming to the channel, finally, the advantage for preventing mis-programming can be improved, since the channel voltage which rises with the coupling with the control gate (word line) becomes larger.

Hereinafter, an operation of the EEPROM according to the first embodiment of the present invention will be explained in detail.

<Read Data>.

Figure 8:
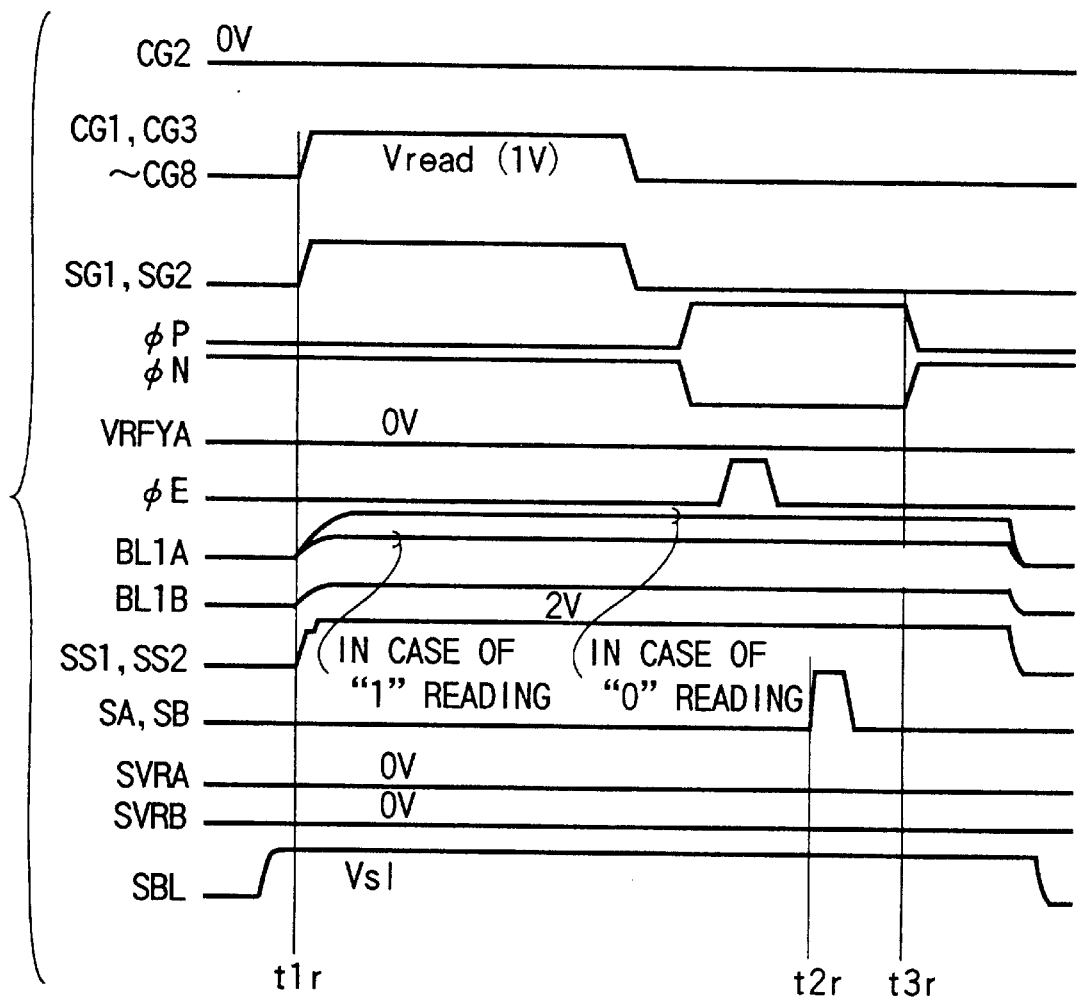
FIG. 8 shows the timing chart showing a read operation of the EEPROM according to the first embodiment of the present invention.
Figures 9A, 9B, 10:
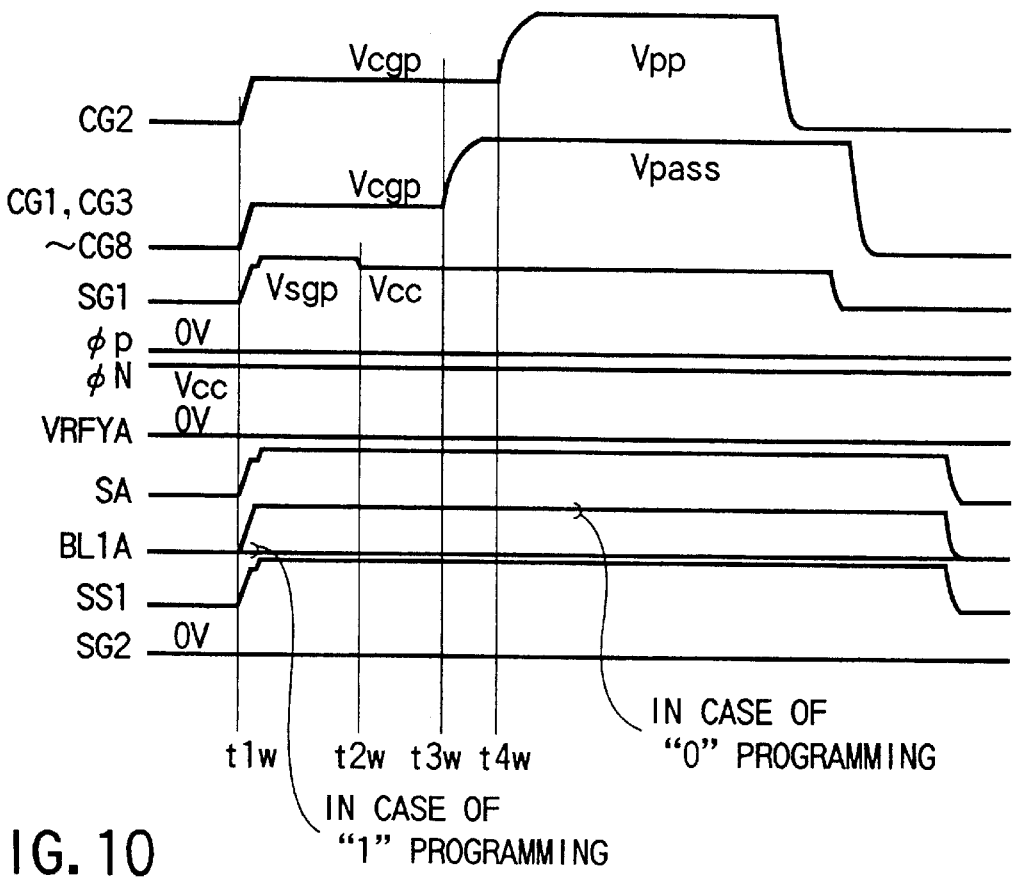
FIG. 9A shows a read data of the EEPROM according to the first embodiment of the present invention.
FIG. 9B shows a programming data of the EEPROM according to the first embodiment of the present invention.
FIG. 10 is a timing chart showing a programming operation of the EEPROM according to the first embodiment of the present invention.

FIG. 8 is a timing chart when reading the memory cell M2 show in FIG. 5, FIG. 9A is a figure showing the data read by the sense amplifier SA1 shown in FIG. 6.

As shown in FIG. 8, first, at time t1r, the selected control gate CG2 is set at "reading voltage (0V)", and the unselected control gates CG1 and CG3 to CG8 are set at "unselected read voltage Vread" respectively. In the present invention, since the threshold voltage Vth of the "1" cell is a negative, the unselected read voltage Vread may be, for example, 1V. Since unselected read voltage Vread can be made a low value, the electric field applies over the oxide film of the "0" cell is eased and read disturb can be reduced.

The select gates SG1 and SG2 is set at "Vcc+Vthsg (Vthsg is the threshold voltage of the select gate)" or "Vcc+2Vthsg". By making the reference voltage wiring SBL shown in FIG. 5 "Vsl", the source line SL is set at "Vsl". For example, this voltage "Vsl" is a power supply voltage Vcc, but may be a voltage higher than the power supply voltage Vcc. In other words, when reading data from the memory cell, the voltage of the source line SL is set at the read reference voltage. The voltages of the unselected control gates CG1 and CG3 to CG8 and the select gates SG1 and SG2 may be a voltage which can sufficiently transfer the voltage "Vsl" of the source line. As a result, the threshold voltage of memory cell M2 is output to bitline BL1A. When reading data "1", the voltage of bitline BL1A becomes equal to or less than 1.5V, and when reading data "0", the voltage of bitline BL1A becomes equal to or more than 2.5V. During this operation, the bitline BL1B charges 2V from the node VB1 shown in FIG. 6. The voltage of node VB1 is the read reference voltage for determining whether the voltage of bitline BL1A is equal to or more than 2V or equal to or less than 2V to distinguish data "0" or "1".

Next, the transistors Q36, Q38 are made in a conductive state at time t2r by the signals SA, SB shown in FIG. 6, and the voltages of bitlines BL1A, BL1B are input to the sense amplifier SA1, respectively. At this time, the voltage of bitline voltage BL1A is charged through the NAND cell in this embodiment. The voltage of the bitline BL1A charged in this way is sensed in the amplifier SA1. Since the voltage of the bitline BL1A or the bitline BL1B is transferred to the sense amplifier SA1 without "threshold voltage drop", the potential of signals SS1, SS2, SA, SB may be set to the higher voltage than power supply voltage "Vcc" and may be set to the higher voltage than the threshold voltage of, e.g. transistors Q35, Q37, Q36, Q38.

In a case that the transistors for transferring the voltage of the bitline such as the transistors Q35, Q37, Q36, Q38 shown in FIG. 6, are constituted by the transistors having the threshold voltage of substantially "0V", the voltage of the signals SS1, SS2, SA, SB may be the power supply voltage "Vcc".

Next, at time t3r, the voltage read by nodes N1, N2 are sensed. As a result, the voltage level of nodes N1, N2 becomes as shown in FIG. 9A according to the read data.

<Programming of Data>

The data programmed in memory cell M2 shown in FIG. 5 is latched by the sense amplifier SA1 shown in FIG. 6. FIG. 9B is a figure showing the data latched by the sense amplifier SA1 shown in FIG. 6. FIG. 10 is a timing chart when programming data into the memory cell M2 shown in FIG. 5.

As shown in FIG. 10, first, at time t1w, control the gates CG1 to CG8 respectively become "Vcgp", the select gate SG1 becomes "Vsgp". The voltage of the bitline is "0V" when programming data "1", the voltage of the bitline, when programming data "0", i.e. the voltage of the unselected bitline for programming is "Vcc". As a result, the voltage of the channel of the memory cell in which data "1" is programmed becomes "0V" and the voltage of the channel of the unselected memory cell for programming becomes "Vcc". The voltage "Vsgp" and the voltage "Vcgp" are respectively voltages which can transfer the programming unselected voltage (Vcc) of the bitline without "threshold voltage drop" and may be, for example, e.g. Vcgp=Vcc, Vsgp=Vcc+2Vthsg.

Next, at time t2w, since the select gate SG1 becomes "Vcc" from "Vsgp", the channel of the unselected memory cell for programming becomes a floating state.

Next, at time t3w, the voltage of the unselected control gates CG1 and CG3 to CG8 become "Vpass (for example, are 10V)", and at time t4w, and the voltage of the selected control gate CG2 becomes "Vpp (for example, 20V)". In this case, Vpass and Vpp can be booted at the same time at time t3w. For example, the channel of the memory cell in which data "0" is programmed is booted to 8V. As described above, the voltage Vcc of the bitline is transferred to the channel of the memory cell programmed "0" in programming without "threshold voltage drop" at the unselected memory cell by setting the threshold voltage of the programmed state to the negative voltage. As a result, finally, since the channel voltage which rises by the coupling with the control gate (the word line) becomes large, it is possible to prevent from the "mis-programming" as described in the related art.

On the other hand, when programming data "1", since the channel voltage is 0V and the control gate CG2 is Vpp, the electron is injected to the floating gate.

<Programming of Data (Different Programming Operation)>

In the present invention, by using the programming method of Local self boost method (IEEE Journal of Solid-State Circuits. Vol.31, No.11, November 1996 pp.1575–1582), each page can be programmed in the optional order.

When using the memory cell having a conventional threshold voltage distribution, in the Local self boost method, data is programmed in order from the memory cell which is farther from the bitline. When taking the case of programming data into memory cell M7 of FIG. 5, 0V (data "1" programming) or power supply voltage Vcc (data "0" programming) is applied to the bitline BL1A according to the programming data. The voltage (SG1) of the gate of the select transistor S1 connected to bitline BL1A is Vcc and the voltage (SG2) of the gate of the select transistor S2 connected to the source line is 0V. The boosted programming voltage Vpgm is applied to the control gate CG7 of selected memory cell M7 (=about 20V), and control gates CG6, CG8 which are arranged at both side of the selected control gate CG7 are set at 0V, respectively. Then, the intermediate voltage Vpass (=about 7V) is applied to the control gates CG1 and CG2 to CG5 of the other unselected memory cells, respectively. As a result, since the channel voltage of the selected memory cell M7 is 0V when programming data "1", a high voltage is applied between the floating gate of this memory cell M7 and the channel. Thereby, electrons are tunnel-injected from the channel (substrate) to the floating gate and the threshold voltage moves to the positive direction.

On the other hand, when programming data "0" (programming unselecting), the channels, sources, and drains of the memory cells Ml to MS are boosted, respectively to 5V by the capacitive coupling between the control gates by applying the intermediate voltage Vpass. As a result, if the threshold voltage of memory cell M6 is, for example, −1V, the memory cell M6 turns "off" and the channel of the memory cell M7 becomes in a floating state. The floating channel becomes about 8V by the capacitive coupling between the control gates, the injection of electron does not occur and the state of data "0" is kept.

When applying Local self boost method to the memory cell having a conventional threshold voltage distribution, it is necessary to program from the memory cell on the side of source line SL. Even if it tries to program data in the memory cell M7 after programmed data in the memory cell M6, since the gate voltage of the memory cell M6 is 0V and the memory cell M6 has a positive threshold voltage, the memory cell M6 turns off. As a result, since the programming voltage of 0V can not be transferred to the selected memory cell M7 from the bitline, it has become a floating and is possible to program.

On the other hand, since the threshold voltage of the programmed state is a negative voltage in the present invention, the page can be selected in the optional order. For example, after programming memory cell M2 shown in FIG. 5, memory cell M6 can be programmed.

Figure 11:
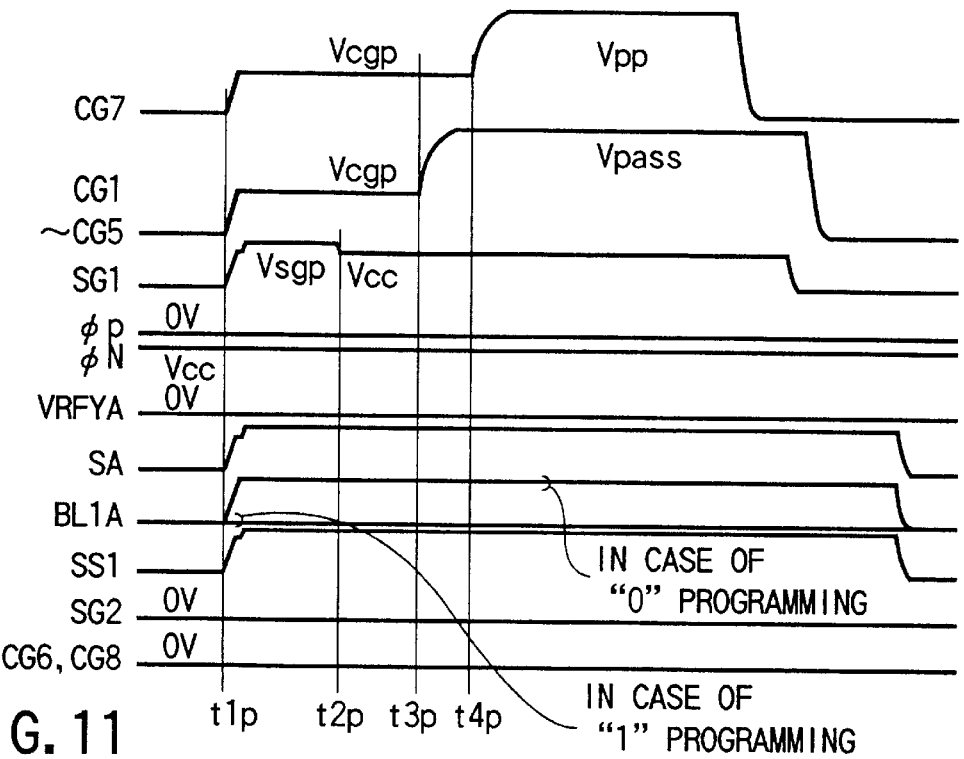
FIG. 11 is a timing chart showing another programming operation of the EEPROM according to the first embodiment of the present invention.

FIG. 11 is the timing chart when programming data using the Local self boost method to the memory cell M7 shown in FIG. 5.

The data shown in FIG. 9B is latched by the sense amplifier SA1 shown in FIG. 6 as the programmed data into Memory cell M7 shown in FIG. 5 like as programming of data explained with reference to FIG. 10.

As shown in FIG. 11, first, the control gates CG1–CG5, CG7 become "Vcgp", respectively, the select gate SG1 becomes "Vsgp", at time t1p. The control gates CG6, CG8 at both sides of the selected control gate CG7 are "0V", respectively. The voltage of the bitline is "0V" when programming data "1", and the voltage of the bitline, i.e. the voltage of the unselected bitline for programming is "Vcc" when programming data "0". As a result, the channel of the memory cell in which data "1" is programmed becomes "0V" and the channel of the unselected memory cell for programming becomes "Vcc". The voltage "vsgp" and the voltage "Vcgp" are respectively the voltage which can transfer the unselect voltage for programming (Vcc) of the bitline to the channel without "threshold voltage drop", and may be, e.g. Vcgp=Vcc, Vsgp=Vcc+2Vthsg.

Next, the select gate SG1 becomes "Vcc" from "Vsgp" at time t2p.

Next, at time t3p, the unselected control gates CG1–CG5 become "Vpass (for example, 6V)" and, at time t4p, the selected control gate CG7 becomes "Vpp (for example, 20V)". The control gates CG6 and CG8 at both sides of the selected control gate CG7 are "0V". The channel of the memory cell in which data "0" is programmed is booted to 8V and electrons are not injected to the floating gate. On the other hand, since the channel of the memory cell in which data "1" is programmed is 0V and control gate CG7 is Vpp, electrons are injected to the floating gate.

<Programming Verify Read>.

Figure 12:
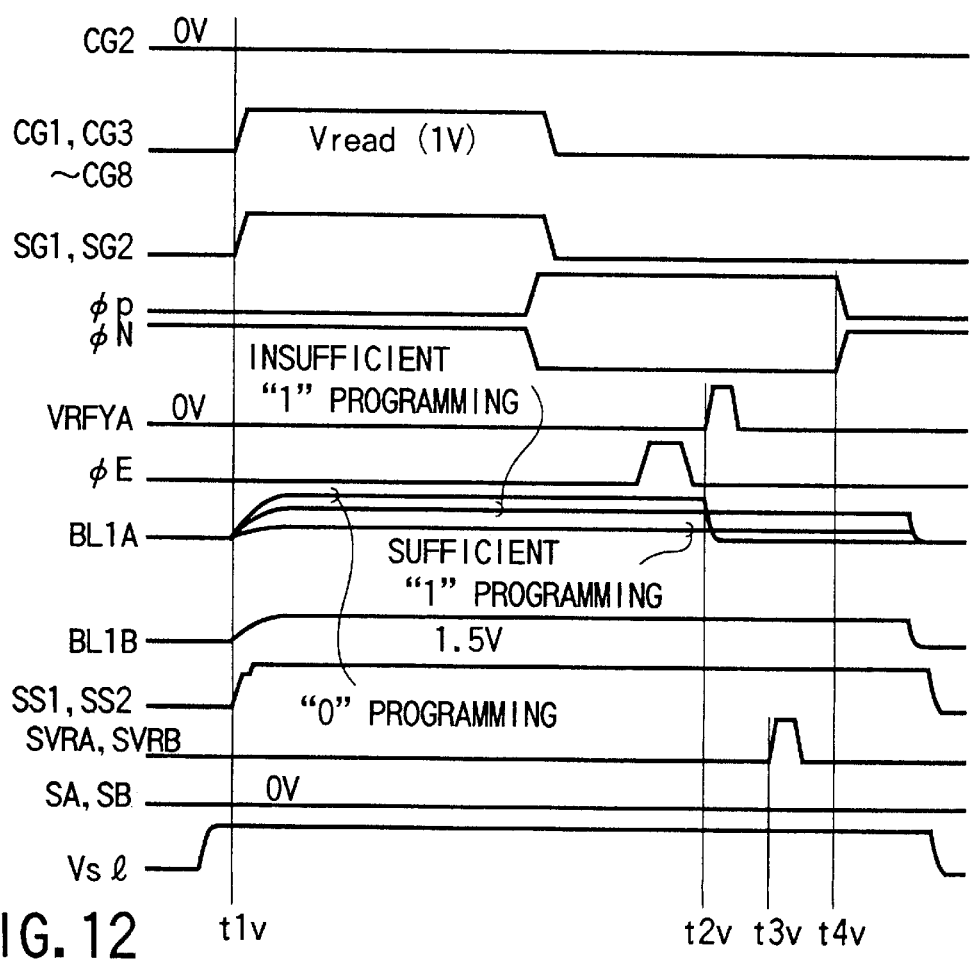
FIG. 12 is a timing chart showing a programming verify read operation of the EEPROM according to the first embodiment of the present invention.

FIG. 12 is a timing chart showing verify-read of the memory cell MC2 shown in FIG. 5.

The programming verify read to examine whether programming was sufficiently done after shown programming operation by FIG. 10 or FIG. 11 is done. Hereinafter, the explained programming verify read can be applied to either of the programming operation which was shown to FIG. 10 or FIG. 11.

As shown in FIG. 12, first, at time t1v, the selected control gate CG2 is set at "0V", and the unselected control gates CG1 and CG3 to CG8 are set eat "Vread (for example, are 1V)", respectively. The select gates SG1 and SG2 is set at "Vcc+Vthsg (Vthsg is the threshold voltage of the select gate)" or "Vcc+2Vthsg", respectively.

By setting the reference voltage wiring SBL shown in FIG. 5 at "Vsl", the voltage of source line SL is set at "Vsl". The voltage "Vsl" may be the power supply voltage Vcc or higher voltage like as the normal read operation explained with reference to FIG. 8. The voltages of the unselected control gates CG1 and CG3 to CG8 and select gates SG1 and SG2 may be the voltage which can transfer the voltage Vsl of the source line! sufficiently, respectively.

As a result, the threshold voltage of memory cell M2 is output to the bitline BL1A. When the programming of data "1" is sufficient, the bitline BL1A become equal to or less than 1V and when the programming of data "1" is insufficient, the bitline BL1A become equal to or more than 2V. In case of data "0" programming, the bitline BL1A becomes equal to or more than 2V. During the operation, the bitline BL1B charges 1.5V from node VB1. The reason why the charged voltage of bitline BL1B is 0.5V lower compared with the time of the normal read explained with referred to FIG. 8 is that a margin of the threshold voltage is provided. As a result, it can be judged only the memory cell which is programmed to the equal to or more than 1.5V threshold voltage is sufficiently programmed.

Next, signal VRFYA becomes "Vcc" at time t2v. That the level of the node N1 is "H" like FIG. 9B is only in case of "0" programming. Therefore, the bitline BL1A of the "0" programming is discharged to equal to or less than 1V through the transistors Q41, Q42. On the other hand, in case of "1" programming, since the level of the node N1 is "L", the transistor Q41 remains off and the voltage of bitline BL1A does not change.

Next, at time t3v, since the signals SVRA, SVRB become "H" level, the transistors Q50, Q51 turn on and the voltage of the bitlines BL1A, BL1B are transferred to the sense amplifier SA1, respectively. The sense amplifier SA1, i.e. a cross-couple latch-type flip-flop is activated at time t4v and the voltage of the nodes N1, N2 are sensed.

In above programming verify operation, the source line SL is set at the read reference voltage and, in this embodiment, the logic of the voltage of the bitline BL1A output through the NAND cell and the programmed data latched by the sense amplifier SA1 which is a flip-flop is taken. As a result, data of the sense amplifier SA1 is updated and set so that the contents of the latched data are additionally programmed to only insufficient programmed memory cell.

Figure 13:
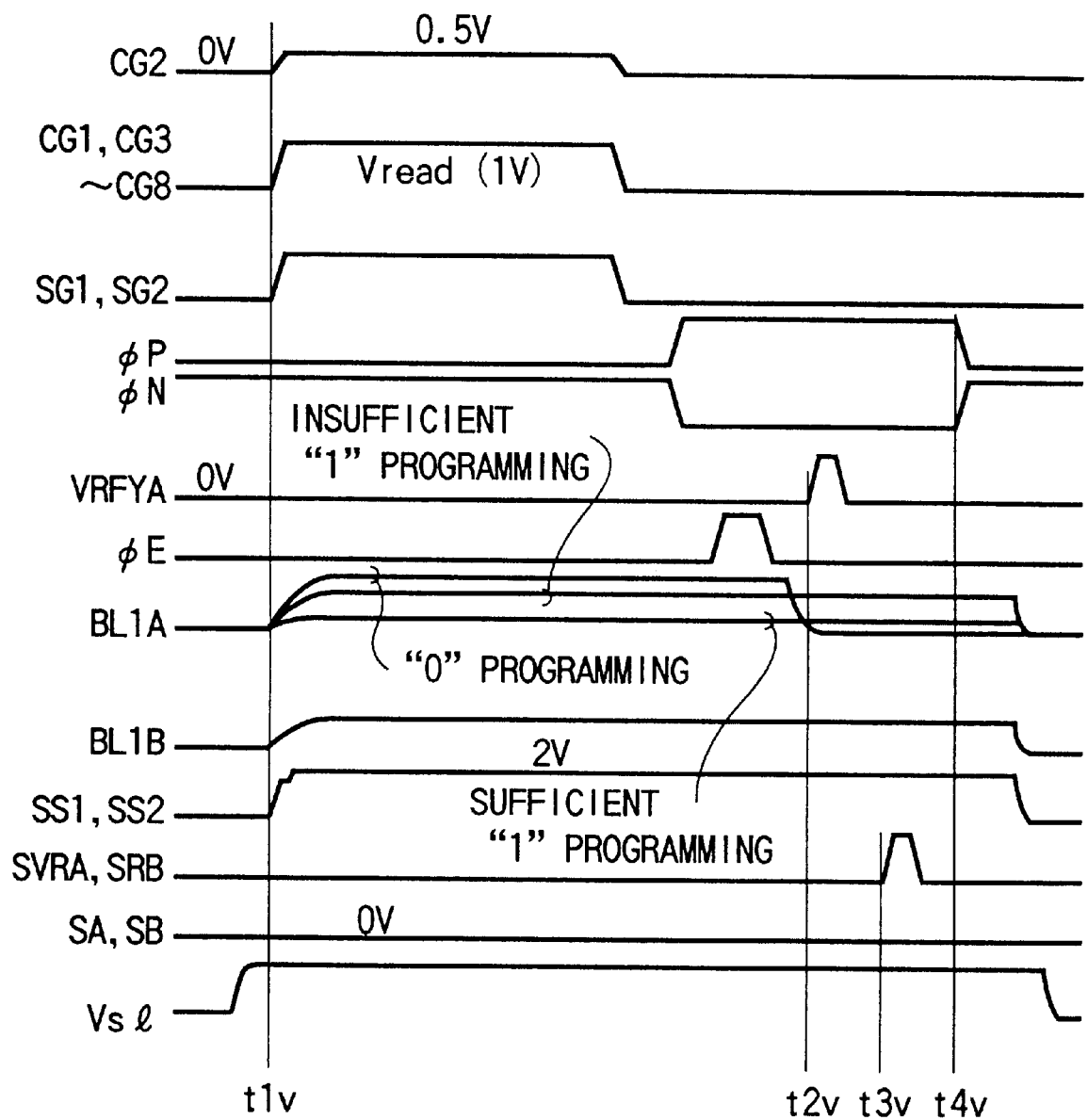
FIG. 13 is a timing chart showing another programming verify read operation of the EEPROM according to the first embodiment of the present invention.

Further, the timing of the programming verify may be performed like FIG. 13. That is, here, to secure a threshold voltage margin by 0.5V, the control gate CG2 is set at 0.5V and the bitline BL1B is set at 2V.

<Erase, Erasure Verify Read>.

In case of erasure, the P-well or the P-type substrate on which a cell is formed is set at Vera (e.g. 20V), and the control gate of the selected memory cell is set at 0V. Then, electrons in the floating gate is discharged to the P-well or the P-type substrate on which a cell is formed.

The erase verify read operation is substantially the same as the read operation. The voltage of the bitline BL1B is not 2V at the time of the reading, but is 2.5V in this operation. The difference of the of the bitline BL1B is to provide a threshold value margin and only the memory cell erased by equal to or less than −2.5V is in the "0" state. When the memory cell of the "1" state exists, further erase operation is performed.

Figure 14:
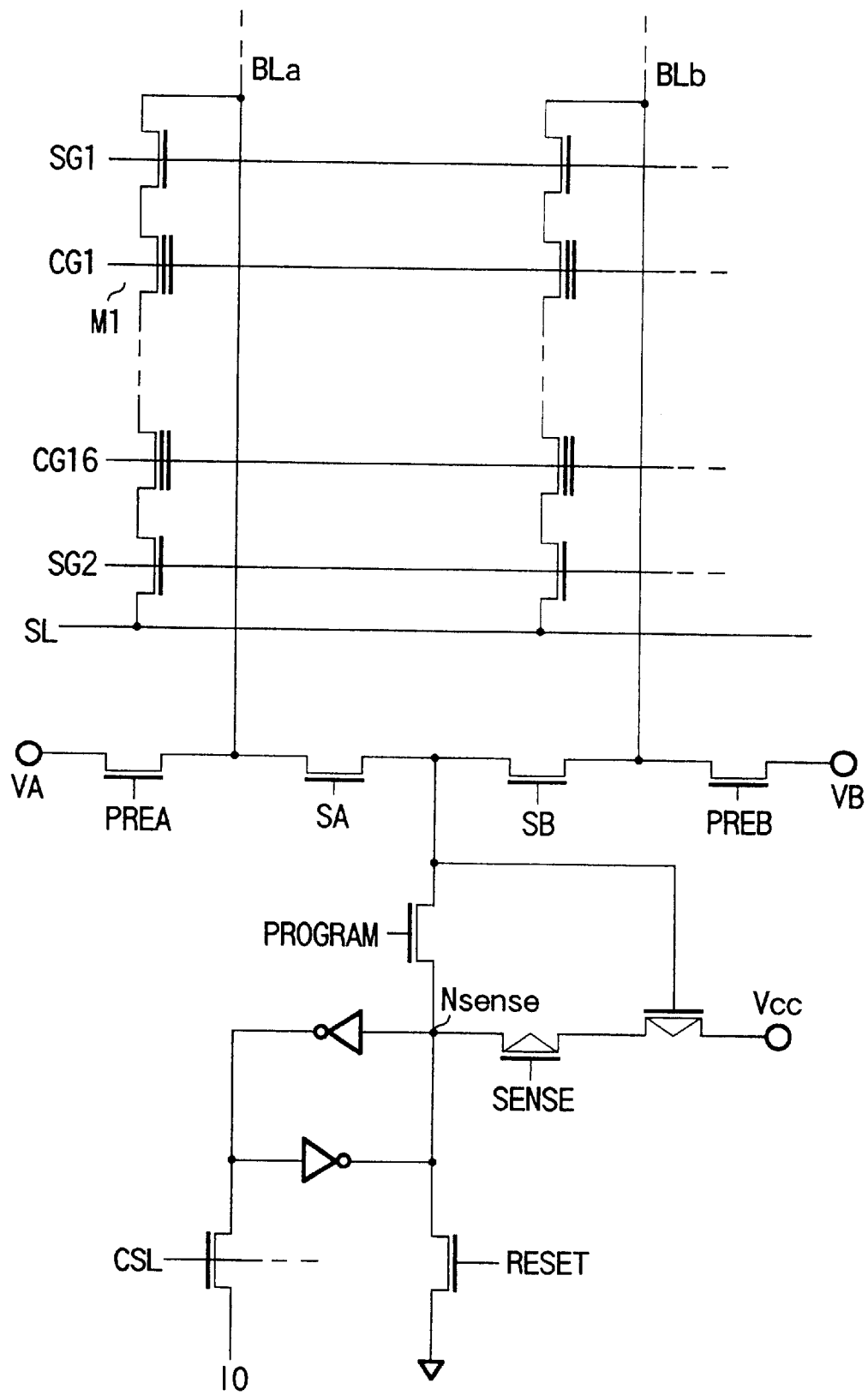
FIG. 14 is a circuit diagram showing a sense amplifier circuit of the EEPROM according to the second embodiment of the present invention.

The sense amplifier of the EEPROM used by the present invention may be a sense amplifier shown in FIG. 14. Hereinafter, an operation of the NAND type EEPROM according to the second embodiment of the present invention using the sense amplifier shown in FIG. 14 will be explained.

<Data Read>.

Figure 15:
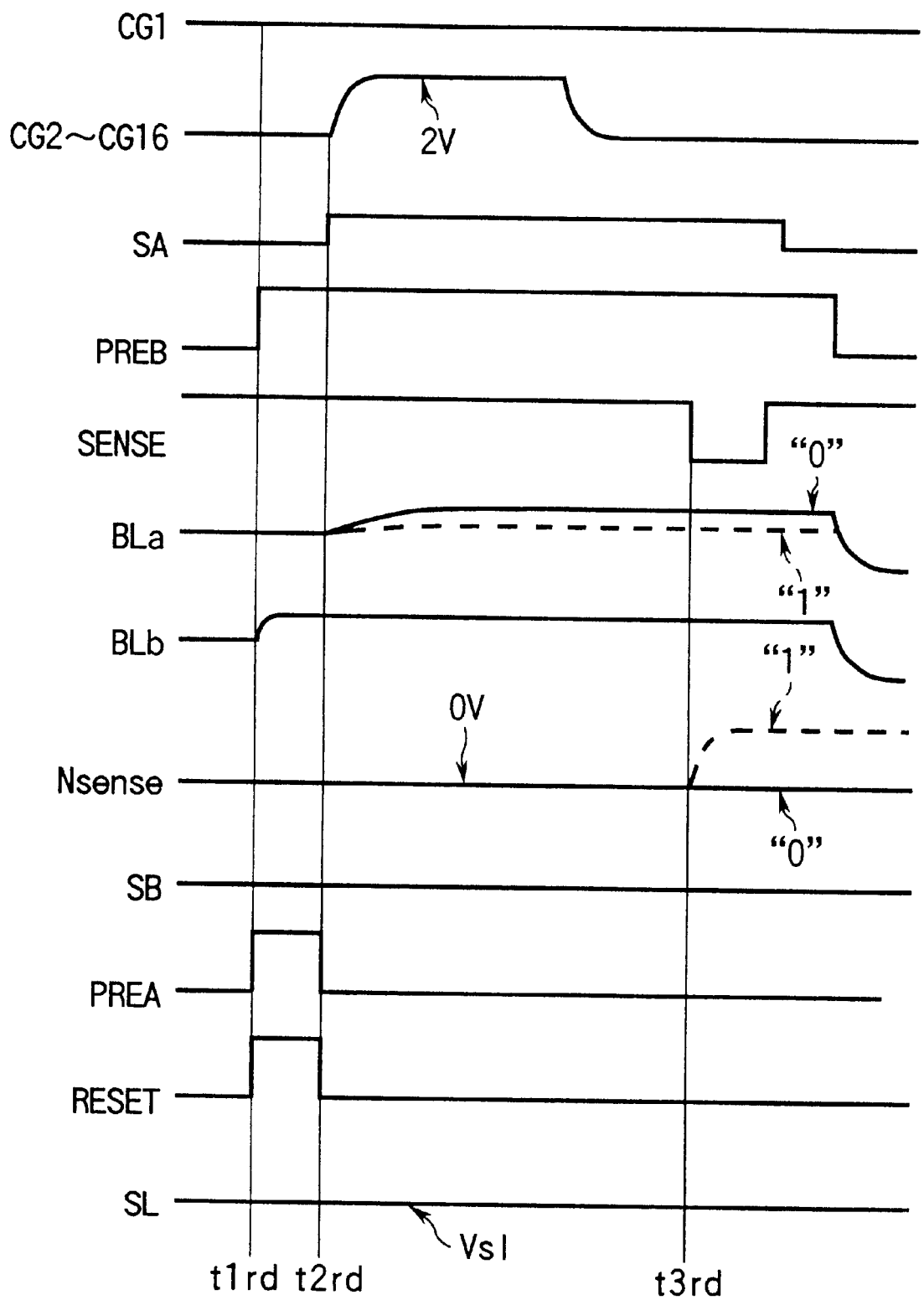
FIG. 15 is a timing chart showing a read operation of the EEPROM according to the second embodiment of the present invention.

FIG. 15 is a timing chart when reading data from the memory cell M1 shown in FIG. 14.

As shown in FIG. 15, at time t1rd, the unselected bitline BLb is charged from the node VB to the voltage Vcc, and the selected bitline BLa is grounded from the node VA. For example, the signal PREB may be Vcc+2Vth (Vth is the threshold voltage of the N channel transistor). Moreover, since the signal RESET becomes "High", the node Nsense in the latch is reset to 0V.

Next, at time t2rd, the selected control gate CG1 is set at 0V, and the unselected control gates CG2–CG16 are set at, for example, 2V. That is, since it is possible to make the unselected gate voltage at the time of the reading to be, for example, 2V because the threshold voltage of the memory cell is a negative, the read disturb characteristic can be improved.

The select gates SG1 and SG2 are set at "Vcc", "Vcc+Vthsg (Vthsg is the threshold voltage of the select gate)" or "Vcc+2Vthsg". The source line SL shown in FIG. 14 is set at "Vsl". For example, "Vsl" may be the power supply voltage Vcc or higher. The voltages of unselected gates CG2–CG16 and the select gates SG1 and SG2 may be the voltage which can sufficiently transfer the source line voltage Vsl.

As a result, the threshold voltage of the memory cell M1 is output to the bitline BLa. In case of the "1" reading, the bitline BLa becomes equal to or less than 1.5V and in case of the "0" reading, the bitline BLa becomes equal to or more than 2.5V. The bitline BLb is maintained by from node VB to Vcc. Since the bitline BLb is maintained by Vcc, the noise caused by the capacitive coupling between the adjacent bitlines can be removed.

Since the signal SENSE becomes "Low" at time t3rd, the voltage of the bitline BLa is sensed and data is held by the latch. To transfer the voltage of the bitline to the sense amplifier without threshold voltage drop, the signal SA may be set at the voltage higher than Vcc. If data is in the "0" state after reading data, the node Nsense becomes "Low", and if the data is in the "1" state, the node Nsense becomes "High".

<Programming of Data>

Figure 16:
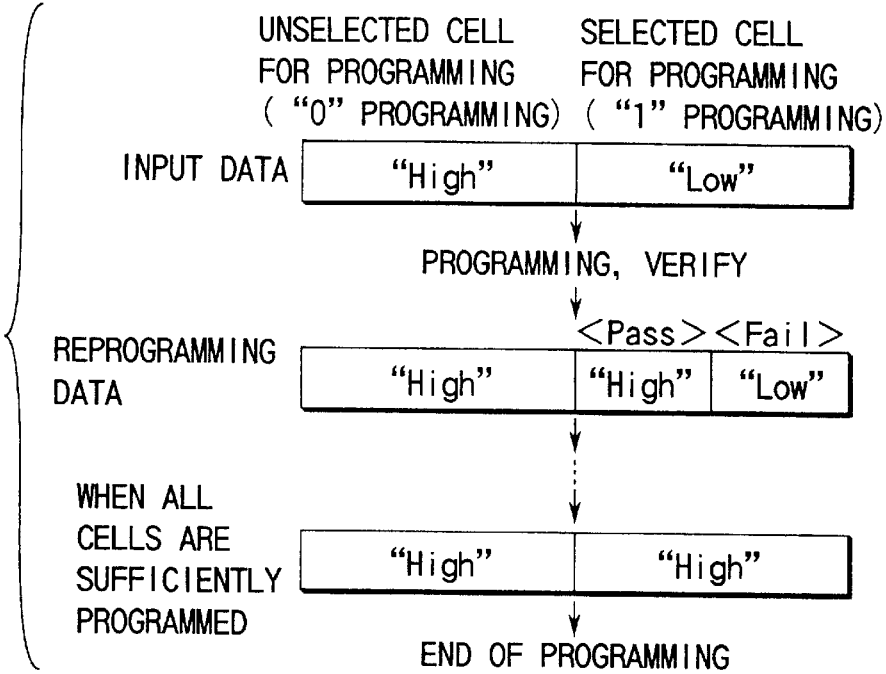
FIG. 16 is a figure showing a latch data (Nsense) of the EEPROM according to the second embodiment of the present invention.

The data programming into the memory cell M1 shown in FIG. 14 is latched by the sense amplifier circuit. FIG. 16 is a figure showing the data of node Nsense in the latch.

By the input of the programming data, in case of "0" programming, the node Nsense becomes "High" and in case of "1" programming, the node Nsense becomes "Low".

Figure 17:
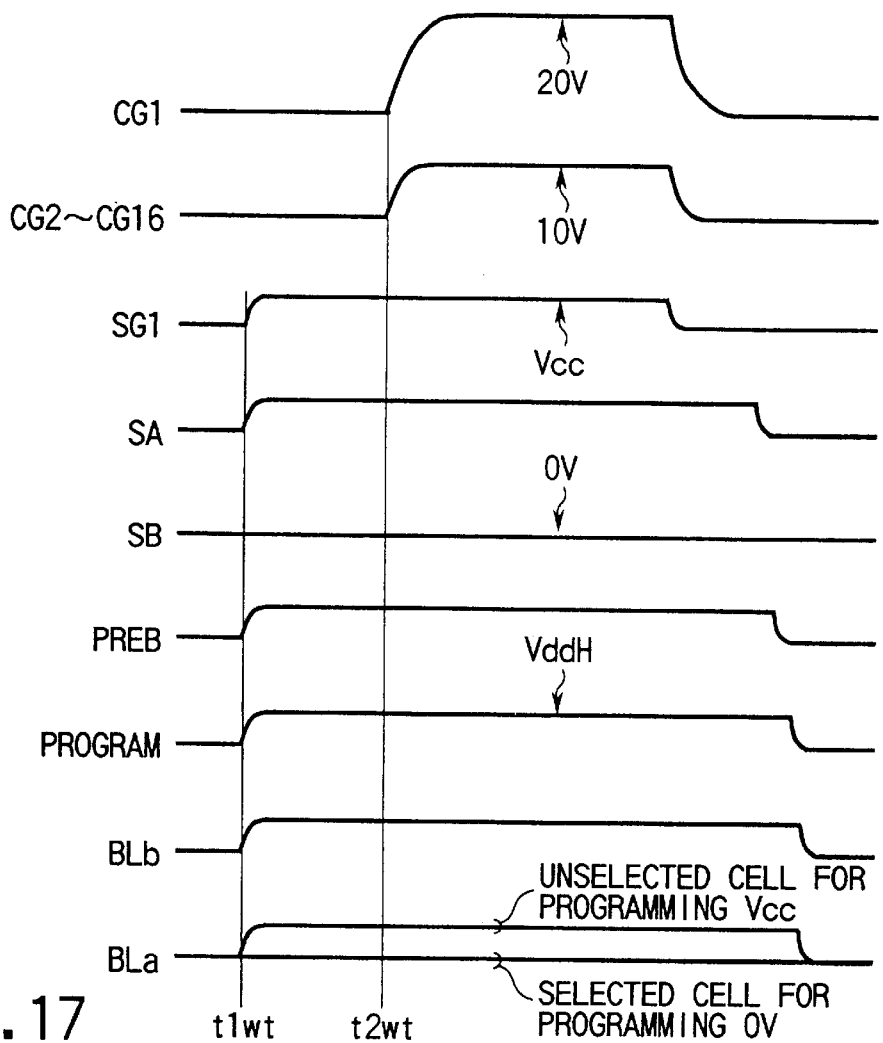
FIG. 17 is a time chart showing a programming operation of the EEPROM according to the second embodiment of the present invention.

FIG. 17 is a timing chart when programming data in the memory cell Ml shown in FIG. 14.

When starting the programming operation, first, at time t1wt, the selected bitline BLa is set at Vcc in case of "0" programming and is set at 0V in case of "1" programming.

Since the memory cell connected to the unselected bitline BLb is not programmed, the bitline BLb is charged at Vcc. The select gate SG1 is Vcc. VddH is the voltage which can transfers Vcc without threshold voltage drop, e.g., Vcc+2Vth.

Next, the control gate CG1 becomes 20V and the control gates CG2–CG16 become 10V at time t2wt. As a result, the channel of the memory cell of the "1" programming becomes 0V and the channel of the memory cell of the "0" programming (the programming non-selecting) is booted to, for example, 8V. The voltage of the bitline is transferred to the channel of the memory cell programmed to "0" in programming without threshold voltage drop of the memory cell by making the threshold voltage of the programmed state the negative voltage. As a result, the channel voltage, which rises with the coupling with the word line, finally becomes large and the mis-programming described in the conventional technique is prevented. On the other hand, since the channel voltage is 0V and the control gate CG2 is 20V in the memory cell programmed to "1", the electrons are injected to the floating gate.

<Programming Verify Read>.

Figure 18:
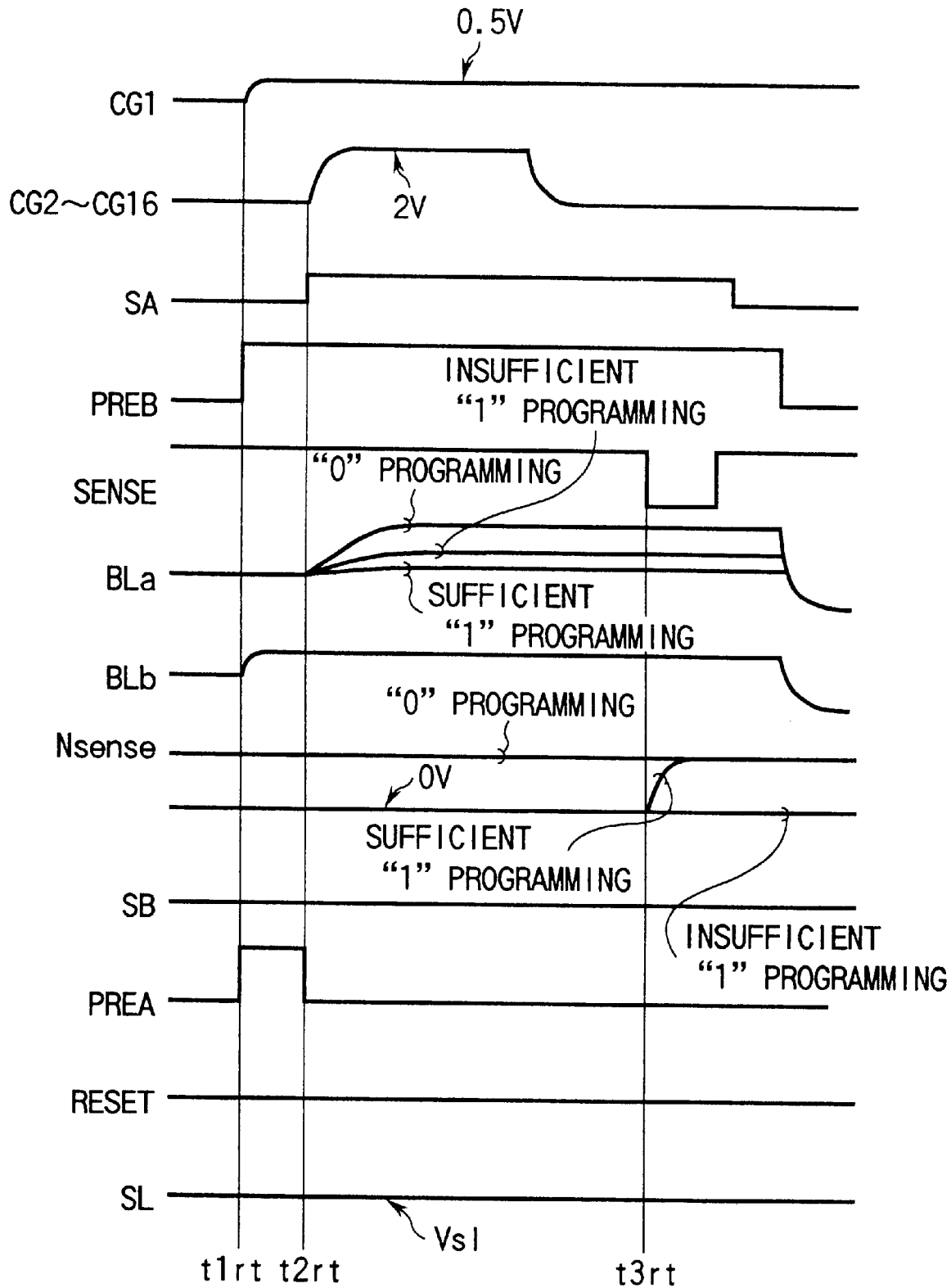
FIG. 18 is a time chart showing a programming verify read operation of the EEPROM according to the second embodiment of the present invention.

The programming verify read to judge whether or not the programming is sufficiently preformed after programming. The verify read is substantially same as a normal read. The programming verify read operation will be explained with reference to FIG. 18.

First, at time t1rt, the latch of the sense amplifier is reset by making the signal RESET "High" in the normal read, but the latch thereof is kept "Low" so as not to reset the programmed data held by the sense amplifier in the programming verify read. In other words, Nsense is "High" in case of "0" programming, and is "Low" in case of "1" programming.

The selected control gate CG1 is 0V at the time of the normal read, but is 0.5V in the programming verify read.

Since the signal SENSE becomes "High" at time t3rt, the voltage of the bitline is detected and latched by the sense amplifier. As a result, as shown in FIG. 16, the data of the latch is set for performing additional programming to only the memory cell which is insufficiently programmed. When "1" is sufficiently programmed at FIG. 16 (described as <Pass> in FIG. 16), the node Nsense becomes "High" and additional programming is not performed. On the other hand, when the "1" programming is insufficient at FIG. 16, the node Nsense becomes "Low" and the additional programming is performed. When the programming is sufficiently performed to the memory cell of all columns, the node Nsense becomes "High" in all columns. The programming may be end by detecting that the node Nsense becomes "High".

In each of the above first and second embodiments, a 2-level memory cell is explained for the example, but the present invention can be also applied to a multi-level memory cell.

Figure 19A:
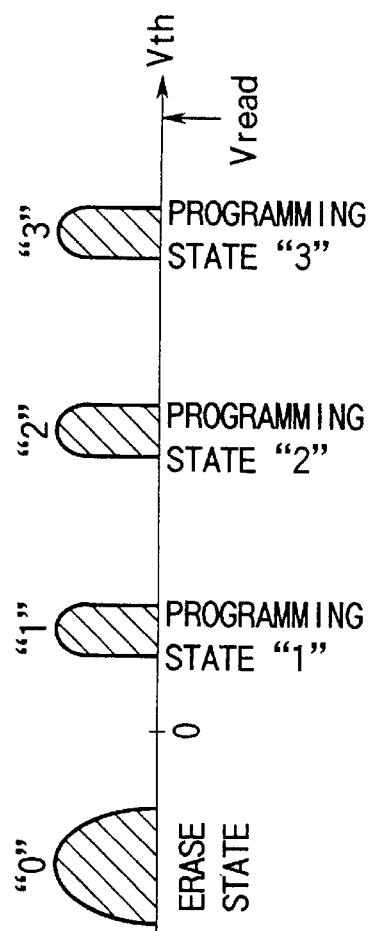
FIG. 19A is a distribution of the threshold voltage of conventional multi-level EEPROM.
Figure 19B:
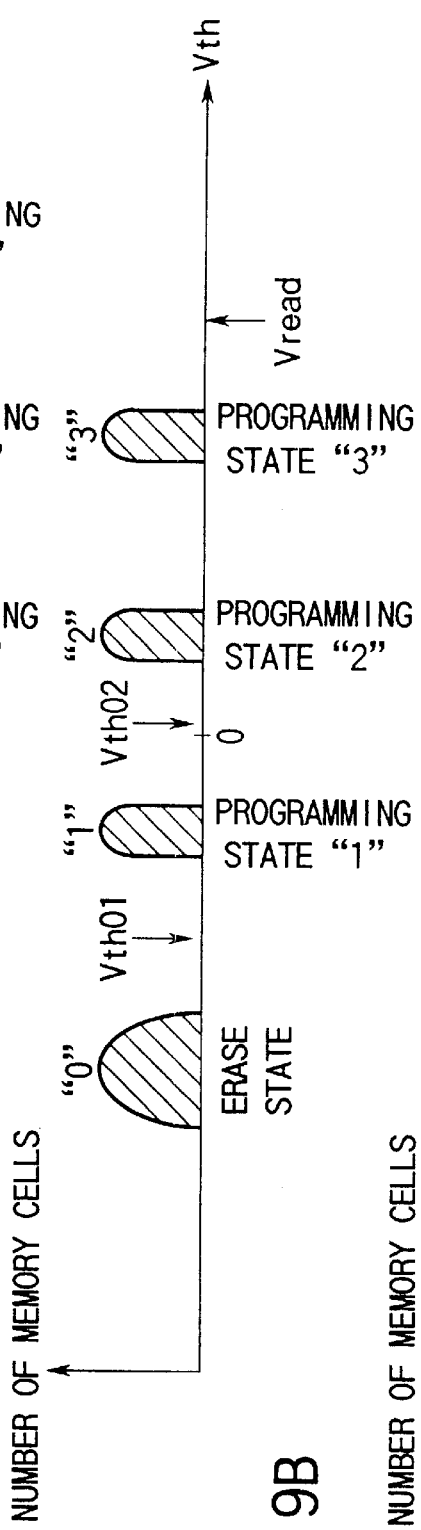
FIG. 19B is a distribution of the threshold voltage of multi-level EEPROM according to the third embodiment of the present invention.
Figure 19C:
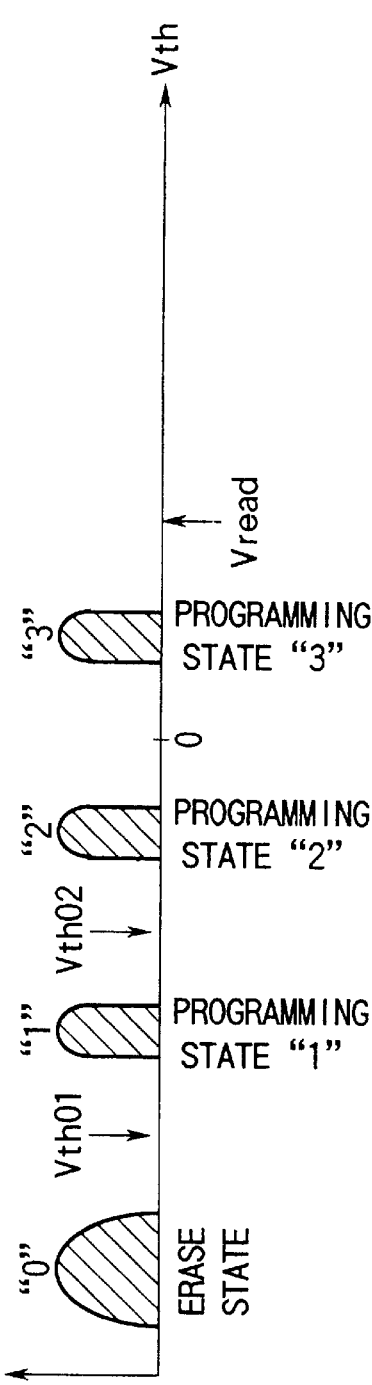
FIG. 19C shows a distribution of another threshold voltage of the multi-level EEPROM according to the third embodiment of the present invention.

FIG. 19A is a figure showing a distribution of the conventional threshold voltage over the multi-level memory cell. FIG. 19B and FIG. 19C are figures showing the distribution of the threshold voltage of the multi-level memory cell according to the third embodiment of the present invention.

As shown in FIG. 19A, conventionally, the threshold voltages of programmed states ("1", "2", and "3") maintain positive voltages, respectively.

On the other hand, in the present invention, at least one of programmed states ("1", "2", and "3") has a negative voltage as shown in FIG. 19B and FIG. 19 C. With this feature, since it is possible to reduce the highest threshold voltage lower than the conventional ones, and the voltage which can be transferred to the memory cell not to be programmed in programming becomes high, it is possible to prevent from the "mis-programming".

Since the unselected read voltage Vread can be lowered in FIG. 19B and FIG. 19C, the read disturb can be reduced.

In case of the multi-level memory cell like as FIG. 19B and FIG. 19C, a threshold voltage after UV erasure is set between "0" and "1" (for example, Vth01 of FIG. 19B and FIG. 19C). Or, the threshold voltage after UV erasure may be set between "1" and "2" (for example, Vth02 of FIG. 19B and FIG. 19C). Especially, when setting a threshold voltage after UV erasure at "Vth02", it is possible to program at high speed.

Also, as described above, according to the present invention, at the time of the data reading of the multi-level memory cell, the sufficient read current can be obtained, and, in addition, the read speed can be improves.

Moreover, the present invention is applied to EEPROMs having any one of memory cells and unit cells such as, for example, NOR type, AND type (A. Nozoe: ISSCC, Digest of Technical Papers, 1995, H. Kume et al.; IEDM Tech. Dig., December 1992, pp. 991–993), DINOR type (S. Kobayashi: ISSCC, Digest of Technical Papers, 1995), Virtual Ground Array type which is one of NOR-type (Lee, et al.: Symposium on VLSI Circuits, Digest of Technical Papers, 1994). The present invention is applied to a mask ROM, an EPROM and so on in addition to the flash memory.

As explained above, according to the present invention, by making the threshold voltage of the memory cell transistor in the programmed state a negative voltage, a so-called "threshold voltage drop" in which the voltage of the source of the N channel-type memory cell transistor lowers for the threshold voltage thereof is canceled.

In multi-level memory, the state that the threshold voltage of the memory cell transistor about the programming state is a negative may not include the state that all distribution of the threshold voltage of programming state "1" is not a negative in FIG. 19B, but may include the state in which a part of the distribution of the threshold voltage of programming state "1" or most of the parts are a negative.

Since the read current at the time of the data read increases, the read speed can be sped up and it is advantageous especially to make memory data a multi-level.

Since the "threshold voltage drop" can be canceled, when N channel-type memory cell transistor is connected in series and composes a unit cell, it is possible to make the voltage of the channel of the memory cell to be sufficiently high voltage. With this, the possibility of the "mis-programming" occurring to the memory cell, which does not inject electrons into the floating gate in programming of data, i.e. the memory cell which is programmed to "0" or the unselected memory cell for programming can be reduced, and it is possible to improve in the reliability of the data programming.

Moreover, the possibility of the read disturb, which occurs to the unselected memory cell for reading by lowering the voltage Vread applied to the gate of the unselected memory cell for reading at the time of the reading of the data, can reduce.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    an electrically rewritable memory cell transistor;
    a word line connected to a gate of said electrically rewritable memory cell transistor; and
    a bitline for transmitting/receiving data to/from said electrically rewritable memory cell transistor, wherein
        a threshold voltage of an erase state of said memory cell transistor is a negative voltage, and a distribution of a threshold voltage of a programming state of said memory cell transistor is a distribution including a negative voltage region.

2. The nonvolatile semiconductor memory device according to claim 1, all threshold voltages of the erase state and the programming state of said memory cell transistor have negative value.

3. The nonvolatile semiconductor memory device according to claim 2, wherein
    said memory cell transistor has a charge storage layer,
    a threshold voltage of said memory cell transistor is determined by the charge stored in said charge storage layer, and
    a threshold voltage of said memory cell transistor when not holding a charge in said charge storage layer is between a threshold voltage of said programmed state and a threshold voltage of said erase state.

4. The nonvolatile semiconductor memory device according to claim 3, wherein a threshold voltage of said memory cell transistor when not holding a charge in said charge storage layer is between a minimum voltage of a threshold voltage of said programmed state and a maximum voltage of a threshold voltage of said erase state.

5. The nonvolatile semiconductor memory device according to claim 2, wherein
    the memory cell unit including said memory cell transistor having an end electrically coupled to a first signal line and another end electrically coupled to a second signal line further comprises a data circuit, for holding data read from said memory cell transistor, and
    when reading data from said memory cell transistor, said second signal line is set at a read reference voltage, a voltage of said first signal line charged through said memory cell unit is sensed by said data circuit.

6. The nonvolatile semiconductor memory device of claim 5, wherein said first signal line is a bitline and said second signal line is a source line.

7. The nonvolatile semiconductor memory device according to claim 2, wherein
    the memory cell unit including said memory cell transistor having a end electrically coupled to a first signal line and another end electrically coupled to a second signal line further comprises a data latch circuit, for holding data read from said memory cell transistor, and
    during programming verify when a state of said memory cell transistor after programming operation is confirmed whether or not it becomes a state corresponding to a desired data and a programming content of said data latch circuit supposed to rewrite only the memory cell transistor which does not reach a state corresponding to the desired data, contents of said data latch circuit are updated based on a voltage of said first signal line changed from said second signal line that is biased to a read reference voltage through said memory cell unit and a programming data held in said data latch circuit.

8. The nonvolatile semiconductor memory device of claim 7, wherein said first signal line is a bitline and said second signal line is a source line.

9. The nonvolatile semiconductor memory device according to claim 2, wherein said memory cell transistor is N-channel type.

10. The nonvolatile semiconductor memory device according to claim 1, wherein said memory cell transistor has a charge storage layer, a threshold voltage of said memory cell transistor is determined by the charge stored in said charge storage layer, and a threshold voltage of said memory cell transistor when not holding a charge in said charge storage layer is between a threshold voltage of said programmed state and a threshold voltage of said erase state.

11. The nonvolatile semiconductor memory device according to claim 10, wherein a threshold voltage of said memory cell transistor when not holding a charge in said charge storage layer is between a minimum voltage of a threshold voltage of said programmed state and a maximum voltage of a threshold voltage of said erase state.

12. The nonvolatile semiconductor memory device according to claim 1, wherein the memory cell unit including said memory cell transistor having an end electrically coupled to a first signal line and another end electrically coupled to a second signal line further comprises a data circuit, for holding data read from said memory cell transistor, and when reading data from said memory cell transistor, said second signal line is set at a read reference voltage, a voltage of said first signal line charged through said memory cell unit is sensed by said data circuit.

13. The nonvolatile semiconductor memory device of claim 12, wherein said first signal line is a bitline and said second signal line is a source line.

14. The nonvolatile semiconductor memory device according to claim 1, wherein the memory cell unit including said memory cell transistor having a end electrically coupled to a first signal line and another end electrically coupled to a second signal line further comprises a data latch circuit, for holding data read from said memory cell transistor, and during programming verify when a state of said memory cell transistor after programming operation is confirmed whether or not it becomes a state corresponding to a desired data and a programming content of said data latch circuit supposed to rewrite only the memory cell transistor which does not reach a state corresponding to the desired data, contents of said data latch circuit are updated based on a voltage of said first signal line changed from said second signal line that is biased to a read reference voltage through said memory cell unit and a programming data held in said data latch circuit.

15. The nonvolatile semiconductor memory device of claim 14, wherein said first signal line is a bitline and said second signal line is a source line.

16. The nonvolatile semiconductor memory device according to claim 1, wherein said memory cell transistor is N-channel type.

17. A nonvolatile semiconductor memory device comprising:

an electrically rewritable memory cell transistor;

a word line connected to a gate of said electrically rewritable memory cell transistor; and a bitline for transmitting/receiving data to/from said electrically rewritable memory cell transistor, wherein a thermal equilibrium threshold voltage of said memory cell transistor, which is a voltage between a maximum threshold voltage of said memory cell and a minimum threshold voltage of said memory cell is a negative voltage.

18. The nonvolatile semiconductor memory device according to claim 17, all threshold voltages of the erase state and the programming state of said memory cell transistor have negative value.

19. The nonvolatile semiconductor memory device according to claim 18, wherein said memory cell transistor has a charge storage layer, a threshold voltage of said memory cell transistor is determined by the charge stored in said charge storage layer, and a threshold voltage of said memory cell transistor when not holding a charge in said charge storage layer is between a threshold voltage of said programmed state and a threshold voltage of said erase state.

20. The nonvolatile semiconductor memory device according to claim 19, wherein a threshold voltage of said memory cell transistor when not holding a charge in said charge storage layer is between a minimum voltage of a threshold voltage of said programmed state and a maximum voltage of a threshold voltage of said erase state.

21. The nonvolatile semiconductor memory device according to claim 18, wherein the memory cell unit including said memory cell transistor having an end electrically coupled to a first signal line and another end electrically coupled to a second signal line further comprises a data circuit, for holding data read from said memory cell transistor, and when reading data from said memory cell transistor, said second signal line is set at a read reference voltage, a voltage of said first signal line charged through said memory cell unit is sensed by said data circuit.

22. The nonvolatile semiconductor memory device of claim 21, wherein said first signal line is a bitline and said second signal line is a source line.

23. The nonvolatile semiconductor memory device according to claim 18, wherein the memory cell unit including said memory cell transistor having a end electrically coupled to a first signal line and another end electrically coupled to a second signal line further comprises a data latch circuit, for holding data read from said memory cell transistor, and during programming verify when a state of said memory cell transistor after programming operation is confirmed whether or not it becomes a state corresponding to a desired data and a programming content of said data latch circuit supposed to rewrite only the memory cell transistor which does not reach a state corresponding to the desired data, contents of said data latch circuit are updated based on a voltage of said first signal line changed from said second signal line that is biased to a read reference voltage through said memory cell unit and a programming data held in said data latch circuit.

24. The nonvolatile semiconductor memory device of claim 23, wherein said first signal line is a bitline and said second signal line is a source line.

25. The nonvolatile semiconductor memory device according to claim 18, wherein said memory cell transistor is N-channel type.

26. The nonvolatile semiconductor memory device according to claim 17, wherein
said memory cell transistor has a charge storage layer,
a threshold voltage of said memory cell transistor is determined by the charge stored in said charge storage layer, and
a threshold voltage of said memory cell transistor when not holding a charge in said charge storage layer is between a threshold voltage of said programmed state and a threshold voltage of said erase state.

27. The nonvolatile semiconductor memory device according to claim 26, wherein a threshold voltage of said memory cell transistor when not holding a charge in said charge storage layer is between a minimum voltage of a threshold voltage of said programmed state and a maximum voltage of a threshold voltage of said erase state.

28. The nonvolatile semiconductor memory device according to claim 17, wherein
the memory cell unit including said memory cell transistor having an end electrically coupled to a first signal line and another end electrically coupled to a second signal line further comprises a data circuit, for holding data read from said memory cell transistor, and
when reading data from said memory cell transistor, said second signal line is set at a read reference voltage, a voltage of said first signal line charged through said memory cell unit is sensed by said data circuit.

29. The nonvolatile semiconductor memory device of claim 28, wherein said first signal line is a bitline and said second signal line is a source line.

30. The nonvolatile semiconductor memory device according to claim 17, wherein
the memory cell unit including said memory cell transistor having a end electrically coupled to a first signal line and another end electrically coupled to a second signal line further comprises a data latch circuit, for holding data read from said memory cell transistor, and
during programming verify when a state of said memory cell transistor after programming operation is confirmed whether or not it becomes a state corresponding to a desired data and a programming content of said data latch circuit supposed to rewrite only the memory cell transistor which does not reach a state corresponding to the desired data,
contents of said data latch circuit are updated based on a voltage of said first signal line changed from said second signal line that is biased to a read reference voltage through said memory cell unit and a programming data held in said data latch circuit.

31. The nonvolatile semiconductor memory device of claim 30, wherein said first signal line is a bitline and said second signal line is a source line.

32. The nonvolatile semiconductor memory device according to claim 17, wherein said memory cell transistor is N-channel type.

33. A nonvolatile semiconductor memory device comprising:
a plurality of electrically rewritable memory cell transistors connected in series;
a plurality of word lines connected to gates of said plurality of electrically rewritable memory cell transistors; and
a bitline for transmitting/receiving data to/from said plurality of electrically rewritable memory cell transistors,
wherein a threshold voltage of an erase state of said memory cell transistor is a negative voltage, and
a distribution of a threshold voltage of a programming state of said memory cell transistor is a distribution including a negative voltage region.

34. The nonvolatile semiconductor memory device according to claim 33, all threshold voltages of the erase state and the programming state of said memory cell transistor have negative value.

35. The nonvolatile semiconductor memory device according to claim 34, wherein
said memory cell transistor has a charge storage layer,
a threshold voltage of said memory cell transistor is determined by the charge stored in said charge storage layer, and
a threshold voltage of said memory cell transistor when not holding a charge in said charge storage layer is between a threshold voltage of said programmed state and a threshold voltage of said erase state.

36. The nonvolatile semiconductor memory device according to claim 35, wherein a threshold voltage of said memory cell transistor when not holding a charge in said charge storage layer is between a minimum voltage of a threshold voltage of said programmed state and a maximum voltage of a threshold voltage of said erase state.

37. The nonvolatile semiconductor memory device according to claim 34, wherein
the memory cell unit including said memory cell transistor having an end electrically coupled to a first signal line and another end electrically coupled to a second signal line further comprises a data circuit, for holding data read from said memory cell transistor, and
when reading data from said memory cell transistor, said second signal line is set at a read reference voltage, a voltage of said first signal line charged through said memory cell unit is sensed by said data circuit.

38. The nonvolatile semiconductor memory device of claim 37, wherein said first signal line is a bitline and said second signal line is a source line.

39. The nonvolatile semiconductor memory device according to claim 34, wherein
the memory cell unit including said memory cell transistor having a end electrically coupled to a first signal line and another end electrically coupled to a second signal line further comprises a data latch circuit, for holding data read from said memory cell transistor, and
during programming verify when a state of said memory cell transistor after programming operation is confirmed whether or not it becomes a state corresponding to a desired data and a programming content of said data latch circuit supposed to rewrite only the memory cell transistor which does not reach a state corresponding to the desired data,
contents of said data latch circuit are updated based on a voltage of said first signal line changed from said second signal line that is biased to a read reference voltage through said memory cell unit and a programming data held in said data latch circuit.

40. The nonvolatile semiconductor memory device of claim 39, wherein said first signal line is a bitline and said second signal line is a source line.

41. The nonvolatile semiconductor memory device according to claim 34, wherein said memory cell transistor is N-channel type.

42. The nonvolatile semiconductor memory device according to claim 33, wherein
said memory cell transistor has a charge storage layer,
a threshold voltage of said memory cell transistor is determined by the charge stored in said charge storage layer, and a threshold voltage of said memory cell transistor when not holding a charge in said charge storage layer is between a threshold voltage of said programmed state and a threshold voltage of said erase state.

43. The nonvolatile semiconductor memory device according to claim 42, wherein a threshold voltage of said memory cell transistor when not holding a charge in said charge storage layer is between a minimum voltage of a threshold voltage of said programmed state and a maximum voltage of a threshold voltage of said erase state.

44. The nonvolatile semiconductor memory device according to claim 33, wherein the memory cell unit including said memory cell transistor having an end electrically coupled to a first signal line and another end electrically coupled to a second signal line further comprises a data circuit, for holding data read from said memory cell transistor, and when reading data from said memory cell transistor, said second signal line is set at a read reference voltage, a voltage of said first signal line charged through said memory cell unit is sensed by said data circuit.

45. The nonvolatile semiconductor memory device of claim 44, wherein said first signal line is a bitline and said second signal line is a source line.

46. The nonvolatile semiconductor memory device according to claim 33, wherein the memory cell unit including said memory cell transistor having a end electrically coupled to a first signal line and another end electrically coupled to a second signal line further comprises a data latch circuit, for holding data read from said memory cell transistor, and during programming verify when a state of said memory cell transistor after programming operation is confirmed whether or not it becomes a state corresponding to a desired data and a programming content of said data latch circuit supposed to rewrite only the memory cell transistor which does not reach a state corresponding to the desired data, contents of said data latch circuit are updated based on a voltage of said first signal line changed from said second signal line that is biased to a read reference voltage through said memory cell unit and a programming data held in said data latch circuit.

47. The nonvolatile semiconductor memory device of claim 46, wherein said first signal line is a bitline and said second signal line is a source line.

48. The nonvolatile semiconductor memory device according to claim 33, wherein said memory cell transistor is N-channel type.

49. A nonvolatile semiconductor memory device comprising:

a memory cell transistor which stores n-levels (n is equal to or more than 2);

a word line connected to a gate of said memory cell transistor; and a bitline for transmitting/receiving data to/from said electrically rewritable memory cell transistor, wherein a threshold voltage of an erase state of said memory cell transistor is a negative voltage, and said memory cell transistor stores n-level data where the threshold voltage regions of discrete first, second, ..., n-th the data are set in low order of the threshold voltage, said first threshold voltage region is in an erase state, said second, ..., n-th threshold voltage regions are in a programmed state, at least one distribution of said second, ..., n-th threshold voltage regions is a distribution including a negative region.

50. The nonvolatile semiconductor memory device according to claim 49, wherein said n is equal to or more than 3, the first threshold voltage region is in an erase state, the second to m-th threshold voltage regions are in a programmed state, and the second to m-th threshold voltage regions have a positive voltage and a negative voltage.

51. The nonvolatile semiconductor memory device according to claim 49, wherein said memory cell transistor has a charge storage layer, a threshold voltage of said memory cell transistor is determined by the charge stored in said charge storage layer, and a threshold voltage of said memory cell transistor when not holding a charge in said charge storage layer is between a threshold voltage of said programmed state and a threshold voltage of said erase state.

52. The nonvolatile semiconductor memory device according to claim 51, wherein a threshold voltage of said memory cell transistor when not holding a charge in said charge storage layer is between a minimum voltage of a threshold voltage of said programmed state and a maximum voltage of a threshold voltage of said erase state.

53. The nonvolatile semiconductor memory device according to claim 49, wherein the memory cell unit including a memory cell transistor having an end electrically coupled to said first signal line and another end electrically coupled to a second signal line further comprises a data circuit, for holding data read from said memory cell transistor, and when reading data from said memory cell transistor, said second signal line is set at a read reference voltage, a voltage of said first signal line charged through said memory cell unit is sensed by said data circuit.

54. The nonvolatile semiconductor memory device of claim 53, wherein said first signal line is a bitline and said second signal line is a source line.

55. The nonvolatile semiconductor memory device according to claim 49, wherein the memory cell unit including said memory cell transistor having a end electrically coupled to a first signal line and another end electrically coupled to a second signal line further comprises a data latch circuit, for holding data read from said memory cell transistor, and during programming verify when a state of said memory cell transistor after programming operation is confirmed whether or not it becomes a state corresponding to a desired data and a programming content of said data latch circuit supposed to rewrite only the memory cell transistor which does not reach a state corresponding to the desired data, contents of said data latch circuit are updated based on a voltage of said first signal line changed from said second signal line that is biased to a read reference voltage through said memory cell unit and a programming data held in said data latch circuit.

56. The nonvolatile semiconductor memory device of claim 55, wherein said first signal line is a bitline and said second signal line is a source line.

57. The nonvolatile semiconductor memory device according to claim 49, wherein said memory cell transistor is N-channel type.

* * * * *